US011288036B2

(12) United States Patent
Kuivalainen et al.

(10) Patent No.: US 11,288,036 B2
(45) Date of Patent: Mar. 29, 2022

(54) ADAPTIVE MODULATION OF AUDIO CONTENT BASED ON BACKGROUND NOISE

(71) Applicant: Microsoft Technology Licensing, LLC, Redmond, WA (US)

(72) Inventors: Jani Samuli Kuivalainen, Redmond, WA (US); Eric Lee Middleton, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 4 days.

(21) Appl. No.: 16/892,250

(22) Filed: Jun. 3, 2020

(65) Prior Publication Data
US 2021/0382679 A1    Dec. 9, 2021

(51) Int. Cl.
*H03G 3/20* (2006.01)
*G06F 3/16* (2006.01)
*H03G 3/30* (2006.01)
*G10L 19/02* (2013.01)
*G10L 25/51* (2013.01)

(52) U.S. Cl.
CPC .............. *G06F 3/165* (2013.01); *G10L 19/02* (2013.01); *G10L 25/51* (2013.01); *H03G 3/3005* (2013.01)

(58) Field of Classification Search
CPC ....................................................... H03G 3/20
See application file for complete search history.

(56) References Cited

U.S. PATENT DOCUMENTS

| 7,333,618 | B2 | 2/2008 | Shuttleworth et al. |
| 8,913,754 | B2 | 12/2014 | McClain |
| 2007/0291959 | A1 | 12/2007 | Seefeldt |
| 2008/0167864 | A1 | 7/2008 | Faller et al. |
| 2009/0097676 | A1 | 4/2009 | Seefeldt |
| 2013/0136266 | A1 | 5/2013 | Mcclain |
| 2015/0078575 | A1 | 3/2015 | Selig et al. |
| 2015/0179181 | A1 | 6/2015 | Morris et al. |
| 2015/0281830 | A1 | 10/2015 | Gauger et al. |
| 2018/0091913 | A1 | 3/2018 | Hartung et al. |

FOREIGN PATENT DOCUMENTS

| EP | 1438669 B1 | 1/2014 |
| EP | 2838196 A1 | 2/2015 |

OTHER PUBLICATIONS

Ratte, et al., Dynamic Volume Adjustment Module, Retrieved From: https://digitalcommons.wpi.edu/cgi/viewcontent.cgi?article=3003&context=mqp-all, Apr. 27, 2017, 55 Pages.
"International Search Report and Written Opinion Issued in PCT Application No. PCT/US21/025692", dated Jul. 14, 2021, 14 Pages.

*Primary Examiner* — Olisa Anwah
(74) *Attorney, Agent, or Firm* — Wade IP Law PLLC

(57) ABSTRACT

Techniques are described herein that are capable of adaptively modulating audio content based on background noise. For instance, a loudness difference between a loudness of the audio content and a loudness of the background noise is determined. The loudness of the audio content is compared to an upper loudness threshold. A modulation is selected from multiple modulations based on the loudness difference and/or the comparison. Subsequent outputted audio content is modulated using the selected modulation.

21 Claims, 9 Drawing Sheets

ADAPTIVE MODULATION OF AUDIO CONTENT BASED ON BACKGROUND NOISE

BACKGROUND

Audio content typically has variations in loudness, which serve to provide atmosphere for a listener of the audio content. Greater variations in the loudness may be perceived by the listener as increasing sound quality of the audio content. However, wide variations in loudness may not be desirable or possible in some situations. For example, if the listener is in a substantially noisy environment, the listener may prefer to sacrifice sound quality in order to be able to distinguish the audio content from the noise. In another example, if the listener is watching a movie with children asleep in an adjacent room, the listener may prefer to keep the volume as low as possible while still being able to hear the quietest parts of the movie.

The loudness of the audio content may be compressed or normalized to reduce a magnitude of the variations in the loudness. Traditionally, parameters for loudness compression or normalization are fixed for a device at the time of manufacture, and the device typically is configured to change loudness compression or normalization based on an overall volume setting of the device, if at all. A trade-off often exists between increasing loudness compression or normalization and increasing sound quality. Manufacturers typically do not know the environments in which users will use the devices and therefore are unable to precisely tune the parameters for loudness compression or normalization to those environments. The manufacturers often use broad assumptions to determine the parameters for various types of devices. For instance, mobile phones typically are configured for a relatively loud environment; whereas, laptops typically are configured for a relatively quiet environment.

SUMMARY

Users often watch or listen to a substantial amount of media. Although users usually want to increase a dynamic range of audio content in the media (e.g., a loudness difference between the quietest and loudest portions of the audio content), the users may encounter situations in which a lesser dynamic range is desirable. For example, a user may have children who are sleeping in an adjacent room. In this example, the user may desire that the audio content have a relatively low dynamic range so that an entirety of the audio content has a substantially equal loudness, and a loudness difference between loud and quiet portions of the audio content is approximately zero. If the user were to decrease the dynamic range for a device that provides the audio content while in the situation described above, audio content provided by the device in other situations may sound dull and not exciting, unless the user were to increase the dynamic range in those situations. It may be desirable for the device to change the dynamic range of the audio content to accommodate various situations without manual input from the user.

Various approaches are described herein for, among other things, adaptively modulating audio content based on (e.g., based at least in part on) background noise. The audio content may be modulated using dynamic range compression and/or automatic gain control (AGC). Dynamic range compression (a.k.a. compression) is an audio signal processing operation that increases a loudness of relatively quieter sounds in audio content and/or decreases a loudness of relatively louder sounds in the audio content, which reduces (i.e., compresses) a dynamic range of the audio content. Downward compression is compression that decreases loudness of each sound in a first portion of audio content based on the loudness of each sound in the first portion exceeding a loudness threshold and that does not change loudness of each sound in a second portion of the audio content based on the loudness of each sound in the second subset not exceeding the loudness threshold. Upward compression is compression that increases loudness of each sound in a first portion of audio content based on the loudness of each sound in the first portion being below a loudness threshold and that does not change loudness of each sound in a second portion of the audio content based on the loudness of each sound in the second subset not being below the loudness threshold. AGC is a closed-loop feedback technique that maintains a specified signal amplitude at an output despite variation of the signal amplitude at an input on which the output is based.

In an example approach, a loudness difference between a loudness of audio content and a loudness of background noise is determined. The loudness of the audio content is compared to an upper loudness threshold. A modulation is selected from multiple modulations based on the loudness difference and/or the comparison. A first modulation is to be selected in accordance with the loudness difference being less than a threshold difference and the loudness of the audio content being less than the upper loudness threshold. A second modulation is to be selected in accordance with the loudness difference being greater than or equal to the threshold difference and the loudness of the audio content being less than the upper loudness threshold. A third modulation is to be selected in accordance with the loudness of the audio content being greater than or equal to the upper loudness threshold. Subsequent outputted audio content is modulated using the selected modulation.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Moreover, it is noted that the invention is not limited to the specific embodiments described in the Detailed Description and/or other sections of this document. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate embodiments of the present invention and, together with the description, further serve to explain the principles involved and to enable a person skilled in the relevant art(s) to make and use the disclosed technologies.

Figure 1:
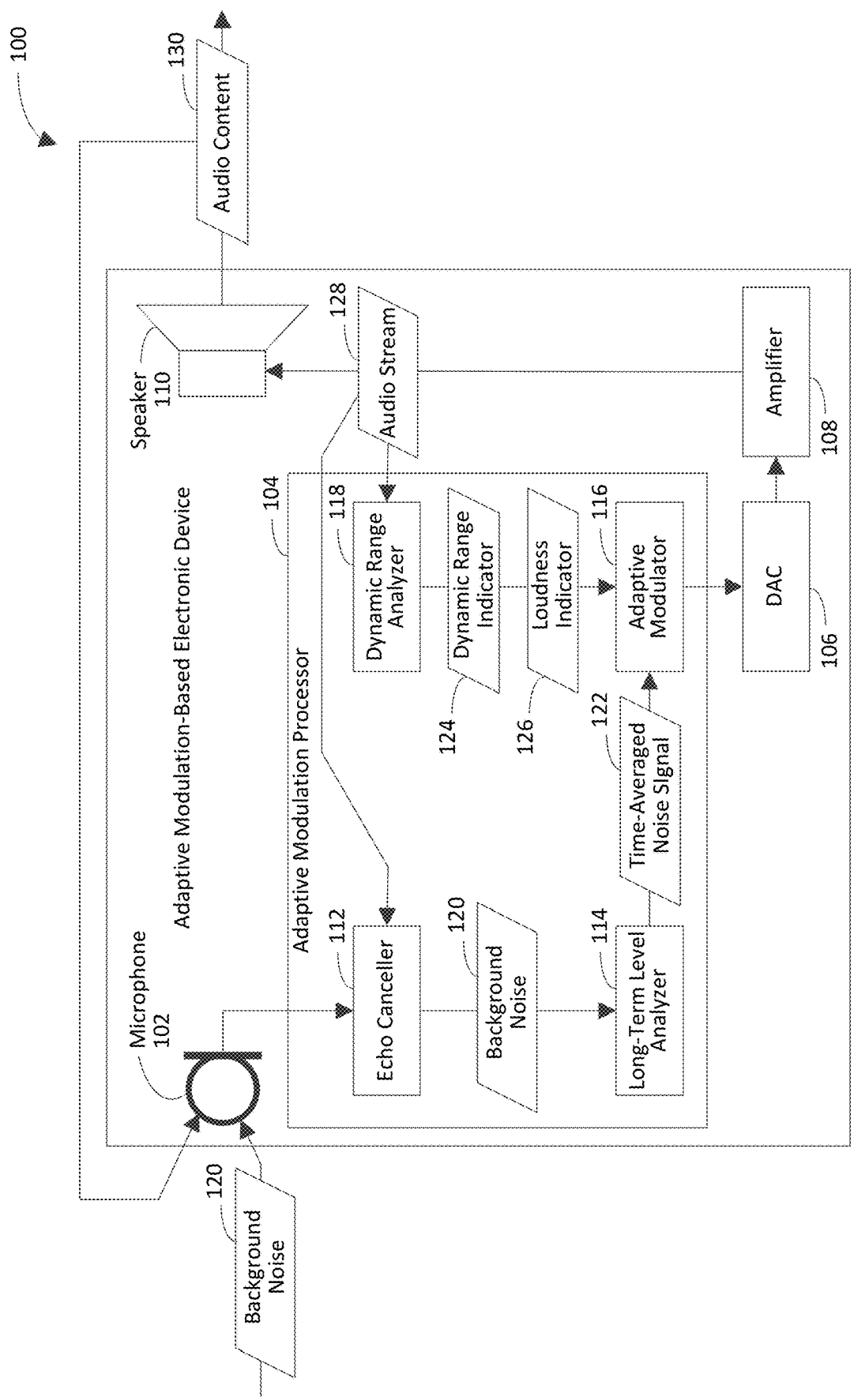
FIG. 1 is a block diagram of an example adaptive modulation-based electronic device in accordance with an embodiment.

The features and advantages of the disclosed technologies will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

I. Introduction

Users often watch or listen to a substantial amount of media. Although users usually want to increase a dynamic range of audio content in the media (e.g., a loudness difference between the quietest and loudest portions of the audio content), the users may encounter situations in which a lesser dynamic range is desirable. For example, if the user is in a substantially noisy environment, the user may wish to reduce the dynamic range of the audio content to enable the user to hear quieter portions of the audio content over the noise. If the user were to decrease the dynamic range for a device that provides the audio content while in the situation described above, audio content provided by the device in other situations may sound dull and not exciting, unless the user were to increase the dynamic range in those situations. It may be desirable for the device to change the dynamic range of the audio content to accommodate various situations without manual input from the user.

II. Example Embodiments

Example embodiments described herein are capable of adaptively modulating audio content based on (e.g., based at least in part on) background noise. The audio content may be modulated using dynamic range compression. Dynamic range compression (a.k.a. compression) is an audio signal processing operation that increases a loudness of relatively quieter sounds in audio content and/or decreases a loudness of relatively louder sounds in the audio content, which reduces (i.e., compresses) a dynamic range of the audio content. Downward compression is compression that decreases loudness of each sound in a first portion of audio content based on the loudness of each sound in the first portion exceeding a loudness threshold and that does not change loudness of each sound in a second portion of the audio content based on the loudness of each sound in the second subset not exceeding the loudness threshold. Upward compression is compression that increases loudness of each sound in a first portion of audio content based on the loudness of each sound in the first portion being below a loudness threshold and that does not change loudness of each sound in a second portion of the audio content based on the loudness of each sound in the second subset not being below the loudness threshold.

Example techniques described herein have a variety of benefits as compared to conventional techniques for modulating audio content. For instance, the example techniques may be capable of adapting modulation (e.g., compression) of the audio content automatically based on the situation (e.g., environment) in which the audio content is being consumed. A situation may be defined at least in part on background noise that is detected in the situation (e.g., a loudness difference between the background noise and the audio content) and/or how close a loudness of the audio content is to a loudness threshold associated with a device that provides the audio content. The modulation may be adjusted by increasing loudness of sounds in the audio content that are relatively quiet and/or decreasing loudness of sounds in the audio content that are relatively loud. An extent to which the loudness of sounds in the audio content is increased or decreased may be based on the situation in which the audio content is being consumed.

The example techniques may increase audio performance of the device that provides the audio content. For instance, the example techniques may increase (e.g., optimize) sound quality of the audio content while increasing a likelihood that quieter sounds in the audio content are capable of being heard by a user of the device. Accordingly, the example techniques may increase a user experience of the user. For instance, the example techniques may substantially reduce a dynamic range of the audio content when loudness of the audio content is near a loudness of the background noise and not near a maximum loudness of the device, maintain a relatively large dynamic range when the loudness of the audio content is substantially more than the loudness of the background noise and not near the maximum loudness of the device, and increase loudness of only relatively quiet sounds in the audio content when the loudness of the audio content is near (e.g., at) the maximum loudness of the device. The example techniques may reduce an amount of time and/or resources that are consumed by the device (or the user thereof) to increase sound quality of the audio content and/or to increase loudness of relatively quiet sounds in the audio content so that they become audible to the user. The example techniques may reduce a number of steps that are performed by the user of the device, an amount of effort that the user expends, and/or an amount of time that the user takes to achieve the aforementioned results. For instance, by automating selection of a modulation to be applied to the audio content from multiple modulations, the example techniques may eliminate a need for the user to perform steps manually to achieve the increased sound quality and/or the increased loudness of the relatively quiet sounds in the audio content based on the context of the device.

FIG. 1 is a block diagram of an example adaptive modulation-based electronic device (hereinafter "electronic device") 100 in accordance with an embodiment. The electronic device 100 is a processing system. An example of a processing system is a system that includes at least one processor that is capable of manipulating data in accordance with a set of instructions. For instance, a processing system may be a computer (e.g., a desktop computer, a laptop computer, a tablet computer, or a wearable computer such as a smart watch or a head-mounted computer), a personal digital assistant, a smart phone, a cellular telephone, a smart speaker, a home theater system, an Internet of things (IoT) device, or the like. Generally speaking, the electronic device 100 operates to provide audio content 130 for consumption by a user of the electronic device 100.

The electronic device 100 includes at least one microphone 102, an adaptive modulation processor 104, a digital-to-analog converter (DAC) 106, an amplifier 108, and a speaker 110. The microphone is a transducer that converts sound into an electrical signal. The microphone(s) 102 are configured to detect the audio content 130 and background noise 120 in the form of sound and to provide a combination of the audio content 130 and the background noise 120 to the adaptive-modulation-based adaptive modulation processor 104 in the form of an electrical signal for processing.

The adaptive modulation processor 104 may be implemented as a digital signal processor (DSP), though the example embodiments are not limited in this respect. The adaptive modulation processor 104 includes an echo canceller 112, a long-term level analyzer 114, an adaptive modulator 116, and a dynamic range analyzer 118. The echo canceller 112 is configured to distinguish the background noise 120 from the audio content 130. For example, the echo canceller 112 may combine an audio stream 128, which serves as an input to the speaker 110, and a transfer function associated with the speaker 110 to generate an estimated audio signal. In accordance with this example, the echo canceller 112 may sample the audio stream 128 continuously or periodically and combine the resulting samples with the transfer function of the speaker 110 to generate the estimated audio signal. The estimated audio signal is an estimate of the audio content 130. In further accordance with this example, the echo canceller 112 may subtract the estimated audio signal from the combination of the audio content 130 and the background noise 120 that is received from the microphone(s) 102 to identify the background noise 120. The echo canceller 112 provides the background noise 120 to the long-term level analyzer 114 for processing.

The long-term level analyzer 114 samples the background noise 120 periodically to generate noise samples corresponding to respective (e.g., consecutive) periods of time. The long-term level analyzer 114 time-averages the noise samples to generate a time-averaged noise signal 122. For instance, the long-term level analyzer 114 may average the noise sample over multiple minutes (e.g., 3-5 minutes) to generate a relatively smooth time-averaged noise signal. The long-term level analyzer 114 may calculate the time-averaged noise signal 122 to be a root-mean square (RMS) noise signal, through the scope of the example embodiments is not limited in this respect. The averaging period may be relatively longer when the audio content 130 corresponds to a common (i.e., same) audio file or source (e.g., the same song or movie). The averaging period may be relatively shorter when the audio content 130 corresponds to different audio files or sources (e.g., when the electronic device 100 switches from one song to another or switches between targeted content and an advertisement) or when the audio content 130 is relatively quiet (e.g., silent).

The sample period that is utilized by the long-term level analyzer 114 to sample the background noise 120 may be based on any of a variety of factors. For example, long-term level analyzer 114 may be configured to sample while the user of the electronic device 100 is using an application, when the user is not speaking, or during relatively quiet portions of the audio content 130 (e.g., when the loudness of the audio content is less than a specified threshold). The long-term level analyzer 114 may monitor software applications that the user is using and trigger a sample when the user changes from a first software application to a second software application. The long-term level analyzer 114 may monitor songs that are being played by the electronic device 100 and trigger a sample when the user changes from a first song to a second song. The long-term level analyzer 114 may take a sample when the user changes (e.g., increases or decreases) a master volume of the electronic device 100. The long-term level analyzer 114 may use an audio profile (a.k.a. fingerprint) of a movie or a song to determine when a sample is to be taken. For instance, the audio profile may indicate portions of the audio content 130 having a loudness that is less than a threshold, and the long-term level analyzer 114 may determine that samples are to be taken during those portions of the audio content. The long-term level analyzer 114 may use an audio profile of a software application (e.g., service) to determine when a sample is to be taken. For instance, the audio profile of the software application may indicate a loudness that is targeted by the software application, and the long-term level analyzer 114 may determine when one or more samples are to be taken based on the targeted loudness.

The sample period may be any suitable period of time (e.g., 1, 2, 3, 4, or 5 minutes). The sample period may be tunable, for example, based on the smoothness of the time-averaged noise signal 122. For instance, if the time-averaged noise signal 122 changes relatively smoothly (e.g., slowly), the long-term level analyzer 114 may configure the sample period to be relatively longer. If the time-averaged noise signal 122 changes relatively sharply (e.g., quickly), the long-term level analyzer 114 may configure the sample period to be relatively shorter. The long-term level analyzer 114 may implement hysteresis to limit (e.g., prevent) unwanted frequent sampling. For instance, a cup hitting against a table may produce a loud noise. However, it may not be desirable to record an abrupt, substantial change in the background noise due to the cup hitting against the table. For example, it may be beneficial for the long-term level analyzer 114 to adjust the time-averaged noise signal 122 when a continuous spectrum of noise is detected. Accordingly, each sample period may overlap a portion (e.g., half) of a preceding sample period.

The long-term level analyzer 114 is described herein as sampling the background noise 120 periodically for illustrative purposes and is not intended to be limiting. It will be recognized that the long-term level analyzer 114 may sample the background noise 120 continuously.

The dynamic range analyzer 118 determines the dynamic range and loudness of the audio content 130. The dynamic range analyzer 118 may determine a root-mean square (RMS) of the audio content 130 and determine the dynamic range and loudness based on the RMS of the audio content 130, through the scope of the example embodiments is not limited in this respect. The dynamic analyzer 118 generates a dynamic range indicator 124 to indicate the dynamic range of the audio content 130. The dynamic analyzer 118 generates a loudness indicator 126 to indicate the loudness of the audio content 130. The dynamic range analyzer 118 determines the dynamic range and loudness of the audio content 130 by combining the audio stream 128 and the transfer function of the speaker 110 to generate the estimated audio signal, as described above with respect to the echo canceller 112, and then determining the dynamic range and loudness of the estimated audio signal. For instance, the dynamic range analyzer 118 may sample the audio stream 128 continuously or periodically and combine the resulting samples with the transfer function of the speaker 110 to generate the estimated audio signal. Loudness may be measured in accordance with any of a variety of standards, including but not limited to an ITU-R BS.1770 standard (e.g., ITU-R BS.1770-3 or ITU-R BS.1770-4), an ISO 532 standard (e.g., ISO 532A, ISO 532B, ISO 532-1:2017, ISO 532-2:2017, or ISO/AWI 532-3), a DIN 45631 standard, an ASA/ANSI S3.4 standard, and a Nordtest ACOU112 standard. It will be recognized that loudness is frequency-dependent.

The adaptive modulator 116 compares the loudness of the audio content 130, as indicated by the loudness indicator 126, to a loudness of the time-averaged noise signal 122. The adaptive modulator 116 selectively adjusts modulation (e.g., dynamic range and/or loudness) of the audio stream 128 and therefore the audio content 130, which is based on the audio stream 128, based on a loudness difference between the loudness of the audio content 130 and the loudness of the time-averaged noise signal 122 and/or a difference between the loudness of the audio content 130 and an upper loudness threshold. The adaptive modulator 116 may be configured to adjust the modulation of the audio stream 128 gradually (e.g., when transitioning from one modulation technique to another modulation technique) to lessen an extent to which the adjustment is perceivable by the user of the electronic device 100. In an example embodiment, the upper loudness threshold is based on a maximum volume setting of the electronic device 100. For instance, the upper loudness threshold may be equal to the maximum volume setting, a fixed amount less than the maximum volume setting, or a variable amount less than the maximum volume setting, wherein the variable amount is based on the loudness of the background noise. In another example embodiment, the upper loudness threshold is based on a maximized digital output value (e.g., "1") of the audio content. For instance, the upper loudness threshold may be equal to the maximized digital output value, a fixed amount less than the maximized digital output value, or a variable amount less than the maximized digital output value, wherein the variable amount is based on the loudness of the background noise.

If the loudness difference is less than a threshold difference and the loudness of the audio content 130 is less than the upper loudness threshold, the adaptive modulator 116 modulates a digital representation of the audio stream 128 in accordance with a first modulation technique. If the loudness difference is greater than or equal to the threshold difference and the loudness of the audio content 130 is less than the upper loudness threshold, the adaptive modulator 116 modulates the digital representation of the audio stream 128 in accordance with a second modulation technique. If the loudness of the audio content is greater than or equal to the upper loudness threshold, the adaptive modulator 116 modulates the digital representation of the audio stream 128 in accordance with a third modulation technique.

In an example compression implementation, the audio stream 128 includes multiple audio components that correspond to respective frequencies. In the compression implementation, the first modulation technique includes compressing the audio stream 128 (and therefore the audio content 130) more than an upper threshold compression amount. In the compression implementation, the second modulation technique includes compressing the audio stream 128 less than a lower threshold compression amount. The lower threshold compression amount is less than or equal to the upper threshold compression amount. In the compression implementation, the third modulation technique includes increasing loudness of a first subset of the audio stream 128 based on each audio component in the first subset having a loudness that is less than a lower loudness threshold and further includes decreasing loudness of a second subset of the audio stream 128 less than a designated threshold amount based on each audio component in the second subset having a loudness that is greater than or equal to the lower loudness threshold. This example compression implementation will be discussed in further detail with reference to FIG. 2 below.

The DAC 106 converts the digital representation of the audio stream 128, which has been selectively modulated by the adaptive modulator 116, into an analog representation of the audio stream 128.

The amplifier 108 amplifies the analog representation of the audio stream 128 to provide an amplified representation of the audio stream 128.

The speaker 110 is a transducer that converts an electrical signal into sound. The speaker 110 is configured to generate the audio content 130 based on the amplified representation of the audio stream 128.

Further detail regarding some example techniques for adaptively modulating the audio content 130 based on the background noise 120 is provided in the following discussion regarding FIGS. 3-6.

Each of the adaptive modulation processor 104, the DAC 106, the amplifier 108, the echo canceller 112, the long-term level analyzer 114, the adaptive modulator 116, and the dynamic range analyzer 118 may be implemented in various ways to facilitate adaptive modulation of the audio content 130 based on the background noise 120, including being implemented in hardware, software, firmware, or any combination thereof. For example, each of the adaptive modulation processor 104, the DAC 106, the amplifier 108, the echo canceller 112, the long-term level analyzer 114, the adaptive modulator 116, and the dynamic range analyzer 118 may be implemented as computer program code configured to be executed in one or more processors. In another example, each of the adaptive modulation processor 104, the DAC 106, the amplifier 108, the echo canceller 112, the long-term level analyzer 114, the adaptive modulator 116, and the dynamic range analyzer 118 may be at least partially implemented as hardware logic/electrical circuitry. For instance, each of the adaptive modulation processor 104, the DAC 106, the amplifier 108, the echo canceller 112, the long-term level analyzer 114, the adaptive modulator 116, and the dynamic range analyzer 118 may be at least partially implemented in a field-programmable gate array (FPGA), an application-specific integrated circuit (ASIC), an application-specific standard product (ASSP), a system-on-a-chip system (SoC), a complex programmable logic device (CPLD), etc. Each SoC may include an integrated circuit chip that includes one or more of a processor (e.g., a microcontroller, microprocessor, digital signal processor (DSP), etc.), memory, one or more communication interfaces, and/or further circuits and/or embedded firmware to perform its functions.

It will be recognized that the electronic device 100 may not include one or more of the components shown in FIG. 1. Furthermore, the electronic device 100 may include components in addition to or in lieu of the any one or more of the components shown in FIG. 1.

Figure 2:
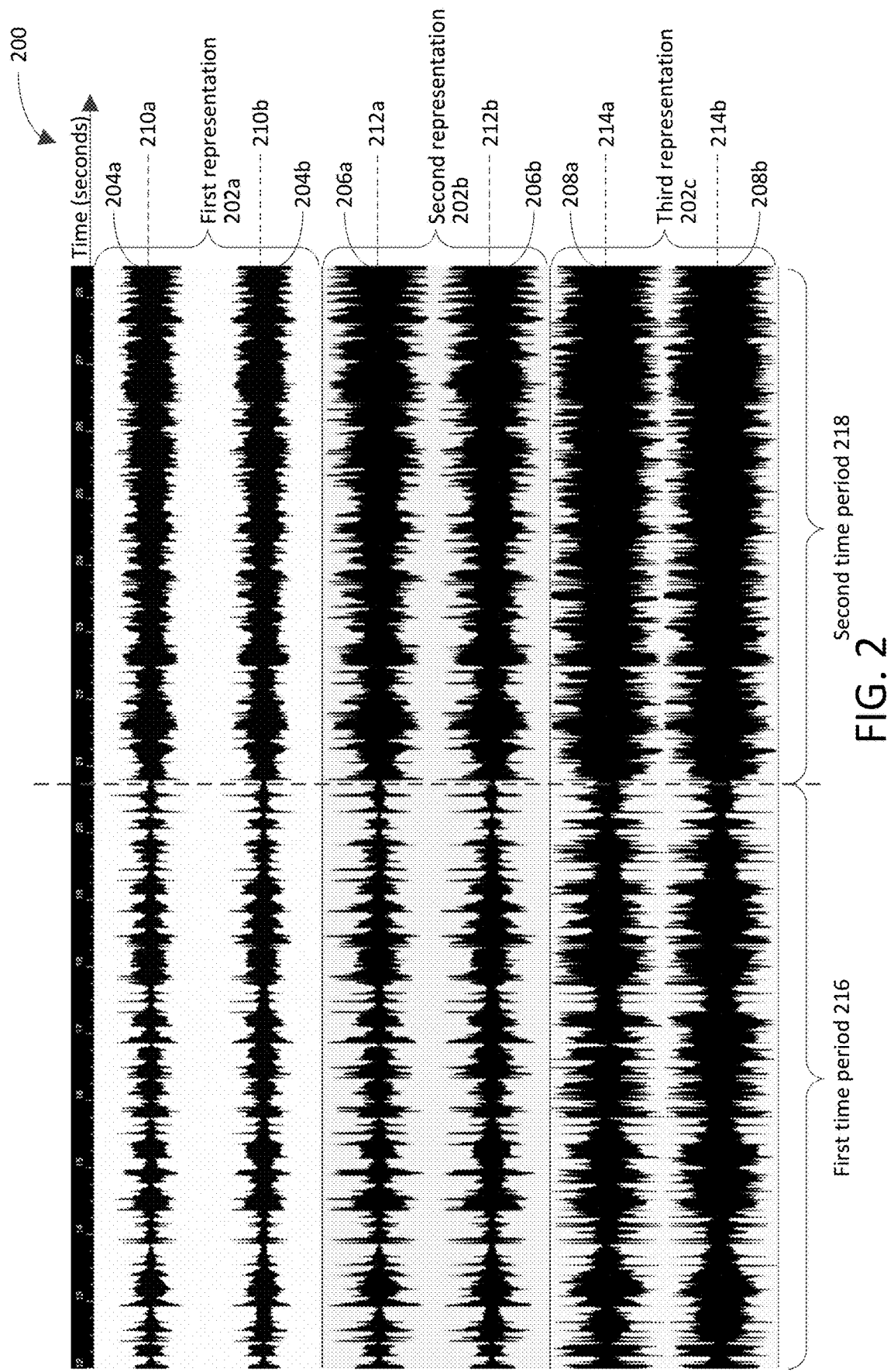
FIG. 2 is a plot of example representations of an audio stream shown in FIG. 1 that are modulated in accordance with respective modulation techniques in accordance with an embodiment.

FIG. 2 is a plot 200 of first, second, and third example representations 230a, 230b, and 230c of the audio stream 128 shown in FIG. 1 that are modulated in accordance with respective modulation techniques in accordance with an embodiment. Each of the first, second, and third representations 230a, 230b, and 230c is shown in a stereo format for non-limiting illustrative purposes. Accordingly, the first representation 230a includes a left channel 204a and a right channel 204b; the second representation 230b includes a left channel 206a and a right channel 206b; and the third representation 230c includes a left channel 208a and a right channel 208b. The left and right channels 204a and 204b of the first representation 202a are modulated about respective axes 210a and 210b. The left and right channels 206a and 206b of the second representation 202b are modulated about respective axes 212*a* and 212*b*. The left and right channels 208*a* and 208*b* of the third representation 202*c* are modulated about respective axes 214*a* and 214*b*. The plot 200 is shown to include a first time period 216 and a second time period 218. For purposes of discussion, the portion of the original unmodulated representation of the audio stream 128 (i.e., prior to modulation) that corresponds to the first time period 216 has a relatively low loudness, and the portion of the original unmodulated representation of the audio stream 128 that corresponds to the second time period 218 has a relatively high loudness. The modulations of the respective first, second, and third representations 230*a*, 230*b*, and 230*c* of the audio stream 128 will now be discussed.

The first representation 230*a* of the audio stream 128 is modulated in accordance with the first modulation technique described above with reference to FIG. 1. For example, the first representation 230*a* of the audio stream 128 may result from compressing the digital representation of the audio stream 128 more than the upper threshold compression amount, as described with regard to the compression implementation. The first modulation technique may be configured to achieve a target loudness for the first representation 230*a*. For instance, the first representation 230*a* may be compressed a relatively lesser amount (e.g., 1 dB) during the first time period 216 and a relatively greater amount (e.g., 6 dB) during the second time period 218 to achieve the target loudness across the first and second time periods 216 and 218. Each of the relatively lesser amount and the relatively greater amount may be more than the upper threshold compression amount. Accordingly, the loudness of the first representation 230*a* during the first time period 216 and the loudness of the first representation 230*a* during the second time period 218 may be substantially the same. Automatic gain control (AGC) may be used to increase or decrease the loudness of the digital representation of the audio stream 128 to achieve the target loudness in response to the digital representation of the audio stream 128 being compressed.

The second representation 230*b* of the audio stream 128 is modulated in accordance with the second modulation technique described above with reference to FIG. 1. For instance, the second representation 230*b* of the audio stream 128 may result from compressing the digital representation of the audio stream 128 less than the lower threshold compression amount, as described with regard to the compression implementation. The second modulation technique may be configured to reproduce the dynamic range of the original unmodulated representation of the audio stream 128 as closely as possible. For example, the second modulation technique may be configured to cause a difference between the dynamic range of the second representation 230*b* and the dynamic range of the original unmodulated representation of the audio stream 128 to be less than a specified threshold. Accordingly, the dynamic range of the second representation 230*b* of the audio stream 128 and the dynamic range of the original unmodulated representation of the audio stream 128 may be substantially the same. In another example, the second modulation technique may be configured to cause a difference between the loudness of the second representation 230*b* and the loudness of the original unmodulated representation of the audio stream 128 to be less than a specified threshold. Accordingly, the loudness of the second representation 230*b* of the audio stream 128 and the loudness of the original unmodulated representation of the audio stream 128 may be substantially the same.

The third representation 230*c* of the audio stream 128 is modulated in accordance with the third modulation technique described above with reference to FIG. 1. For example, the third representation 230*c* of the audio stream 128 may result from increasing the loudness of the first subset of the digital representation of the audio stream 128 (in which each audio component has a loudness that is less than the lower loudness threshold) and further from decreasing the loudness of the second subset of the digital representation of the audio stream 128 (in which each audio component has a loudness that is greater than or equal to the lower loudness threshold) less than the designated threshold amount, as described with regard to the compression implementation. One way to implement the third modulation is to compress and amplify the digital representation of the third representation 230*c* (i.e., compress and amplify both the first subset and the second subset) such that the loudness of the first (relatively quieter) subset increases while the loudness of the second (relatively louder) subset is reduced less than the designated threshold amount. For instance, the loudness of the second subset may not be reduced at all. Implementing the third modulation in this manner may be helpful when the loudness of the second subset is substantially clipped by reaching a maximum capability of the electronic device 100. Another way to implement the third modulation is to amplify the first subset and not the second subset. In accordance with this way of implementing the third modulation, the second subset may be compressed so long as the loudness of the second subset is reduced less than the designated threshold amount. The third modulation technique may be configured to maximize the loudness of the third representation 230*c* (e.g., across the first and second time periods).

FIGS. 3-6 depict flowcharts 300, 400, 500, and 600 of example methods for adaptively modulating audio content based on background noise in accordance with embodiments. Flowcharts 300, 400, 500, and 600 may be performed by the adaptive modulator 116 shown in FIG. 1, for example. For illustrative purposes, flowcharts 300, 400, 500, and 600 are described with respect to an adaptive modulator 700 shown in FIG. 7, which is an example implementation of the adaptive modulator 116 shown in FIG. 1. The adaptive modulator 700 includes determination logic 732, comparison logic 734, selection logic 736, and modulation logic 738. Further structural and operational embodiments will be apparent to persons skilled in the relevant art(s) based on the discussion regarding flowcharts 300, 400, 500, and 600.

Figure 3:
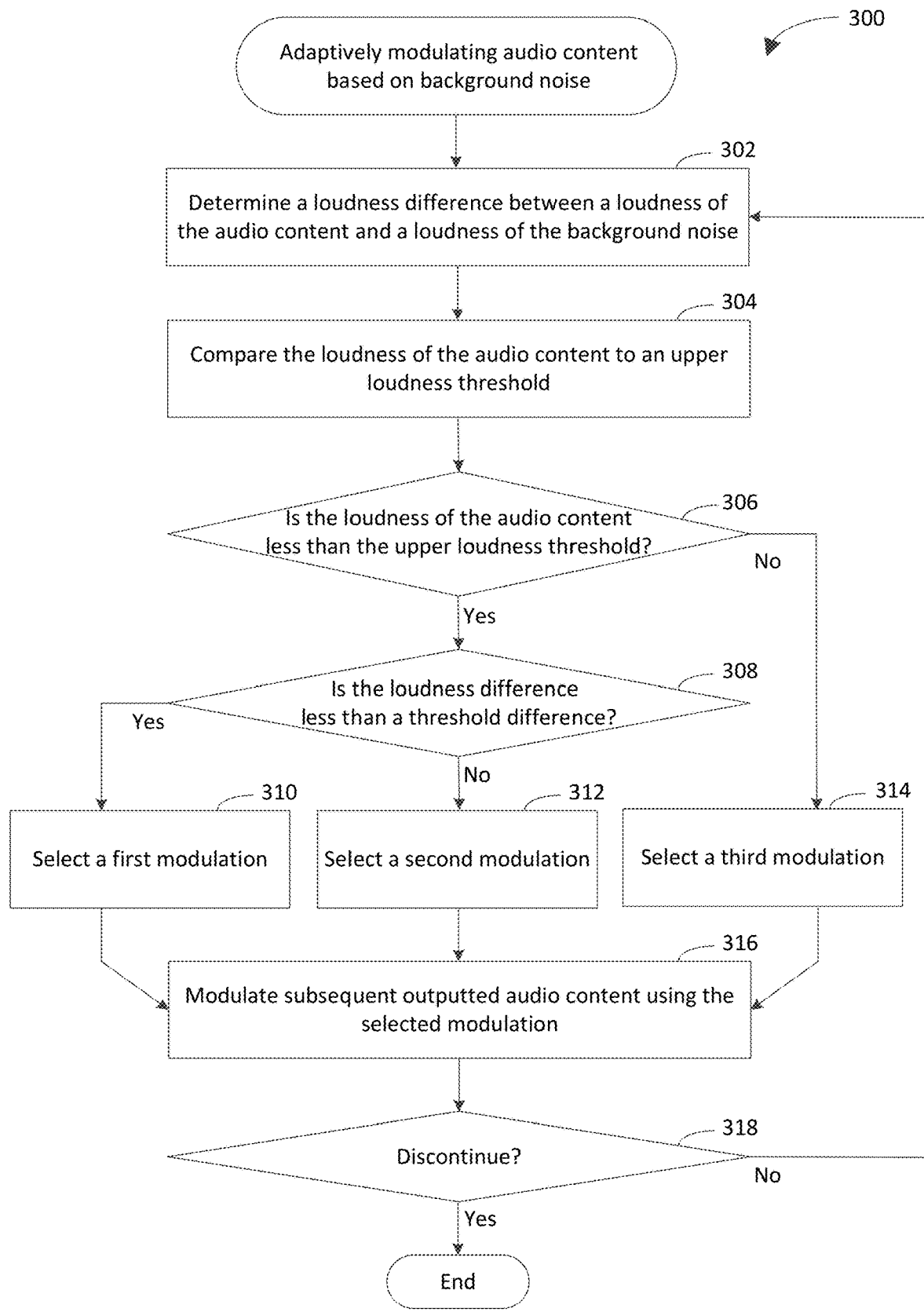
FIGS. 3-6 depict flowcharts of example methods for adaptively modulating audio content based on background noise in accordance with embodiments.

As shown in FIG. 3, the method of flowchart 300 begins at step 302. In step 302, a loudness difference between a loudness of the audio content and a loudness of the background noise is determined. For example, the audio content may be outputted (e.g., generated) by a speaker, and the background noise may be detected in an environment of the speaker. In accordance with this example, the background noise may be sounds other than the audio content that are detected in the environment. In an example implementation, the determination logic 732 determines the loudness difference between the loudness of the audio content and the loudness of the background noise. For instance, the determination logic 732 may determine the loudness difference by analyzing the time-averaged noise signal 722 and the loudness indicator 726. The loudness indicator 726 indicates the loudness of the audio content. The time-averaged noise signal 722 is a time-averaged representation of the background noise. Thus, the loudness of the time-averaged noise signal 722 represents the loudness of the background noise. The determination logic 732 may determine the loudness difference by subtracting loudness of the time-averaged noise signal 722 from the loudness that is indicated by the loudness indicator 726. Accordingly, the loudness indicated by the loudness indicator 726 being negative may indicate that the loudness of the audio content is less than the loudness of the background noise. The loudness indicated by the loudness indicator 726 being zero may indicate that the loudness of the audio content and the loudness of the background noise are same. The loudness indicated by the loudness indicator 726 being positive may indicate that the loudness of the audio content is greater than the loudness of the background noise. The determination logic 732 may generate a loudness difference indicator 740 to indicate the loudness difference.

At step 304, the loudness of the audio content is compared to an upper loudness threshold. In an example implementation, the comparison logic 734 compares the loudness of the audio content to the upper loudness threshold. For instance, an upper loudness threshold indicator 742 may indicate the upper loudness threshold. The comparison logic 734 may compare the loudness that is indicated by the loudness indicator 726 and the upper loudness threshold that is indicated by the upper loudness threshold indicator 742 to determine a second loudness difference. For example, the comparison logic 734 may subtract the upper loudness threshold from the loudness that is indicated by the loudness indicator 726 to determine the second loudness difference. In accordance with this example, the second loudness difference being positive indicates that the loudness of the audio content is greater than the upper loudness threshold. In further accordance with this example, the second loudness difference being zero indicates that the loudness of the audio content and the upper loudness threshold are same. In further accordance with this example, the second loudness difference being negative indicates that the loudness of the audio content is less than the upper loudness threshold. The comparison logic 734 may generate comparison information 744 to indicate the second loudness difference.

At step 306, a determination is made whether the loudness of the audio content is less than the upper threshold. If the loudness of the audio content is less than the upper limit, flow continues to step 308. Otherwise, flow continues to step 314. In an example implementation, selection logic 736 determines whether the loudness of the audio content is less than the upper threshold. For instance, the selection logic 736 may analyze the comparison information 744 to determine the second loudness difference between the loudness of the audio content and the upper loudness threshold. For example, the selection logic 736 may determine that the loudness of the audio content is less than the upper threshold based on the second loudness difference being negative. In accordance with this example, the selection logic 736 may determine that the loudness of the audio content is not less than (i.e., is greater than or equal to) the upper loudness threshold based on the second loudness difference being positive or zero.

At step 308, a determination is made whether the loudness difference between the loudness of the audio content and the loudness of the background noise is less than a threshold difference. If the loudness difference is less than the threshold difference, flow continues to step 310. Otherwise, flow continues to step 312. In an example implementation, the selection logic 736 determines whether the loudness difference between the loudness of the audio content and the loudness of the background noise is less than the threshold difference. For instance, the selection logic 736 may analyze the loudness difference indicator 740 to determine the loudness difference. The selection logic 736 may subtract the threshold difference from the loudness difference that is indicated by the loudness difference indicator 740 to determine whether the loudness difference is less than the threshold difference.

At step 310, a first modulation is selected. In an example implementation, the selection logic 736 selects the first modulation. The selection logic 736 selects the first modulation based on the loudness of the audio content being less than the upper loudness threshold and further based on the loudness difference between the loudness of the audio content and the loudness of the background noise being less than the threshold difference. The selection logic 736 may generate a modulation indicator 748 to indicate that the first modulation is selected.

At step 312, a second modulation is selected. In an example implementation, the selection logic 736 selects the second modulation. The selection logic 736 selects the second modulation based on the loudness of the audio content being less than the upper loudness threshold and further based on the loudness difference between the loudness of the audio content and the loudness of the background noise not being less than (i.e., being greater than or equal to) the threshold difference. The selection logic 736 may generate the modulation indicator 748 to indicate that the second modulation is selected.

At step 314, a third modulation is selected. In an example implementation, the selection logic 736 selects the third modulation. The selection logic 736 selects the third modulation based on the loudness of the audio content not being less than (i.e., being greater than or equal to) the upper loudness threshold. The selection logic 736 may generate the modulation indicator 748 to indicate that the third modulation is selected.

At step 316, subsequent outputted audio content is modulated using the selected modulation. In an example implementation, the modulation logic 738 performs a modulation operation 750 to modulate the subsequent outputted audio content using the selected modulation. For example, the modulation logic 738 may analyze the modulation indicator 748 to determine which modulation has been selected by the selection logic 736. In accordance with this example, the modulation logic 738 modulates the subsequent outputted audio content using the first modulation if the modulation indicator 738 indicates that the first modulation has been selected. The modulation logic 738 modulates the subsequent outputted audio content using the second modulation if the modulation indicator 738 indicates that the second modulation has been selected. The modulation logic 738 modulates the subsequent outputted audio content using the third modulation if the modulation indicator 738 indicates that the third modulation has been selected. The modulation logic 738 may analyze the dynamic range indicator 724 to determine the dynamic range of the audio content. The modulation logic 738 may modulate the subsequent outputted audio content using the selected modulation based on the dynamic range that is indicated by the dynamic range indicator 724. The modulation logic 738 may fade in changes to a previous modulation over a non-zero period of time to result in the selected modulation. For instance, the changes may be gradually applied to the previous modulation over multiple minutes to achieve the selected modulation.

At step 318, a determination is made whether to discontinue adaptively modulating the audio content. If adaptive modulation of the audio content is to be discontinued, the flowchart 300 ends. Otherwise, flow returns to step 302. For instance, the adaptive modulation may continue until an interrupt is encountered. In an example implementation, the determination logic 732 determines whether to discontinue the adaptive modulation of the audio content.

In an example embodiment, the audio content includes multiple audio components that correspond to respective frequencies. In accordance with this embodiment, the first modulation is configured to compress the audio content more than an upper threshold compression amount. In further accordance with this embodiment, the second modulation is configured to compress the audio content less than a lower threshold compression amount. The lower threshold compression amount is less than or equal to the upper threshold compression amount. In further accordance with this embodiment, the third modulation is configured to increase loudness of a first subset of the audio components and to decrease loudness of a second subset of the audio components based on each audio component in the first subset having a loudness that is less than a lower loudness threshold and further based on each audio component in the second subset having a loudness that is greater than or equal to the lower loudness threshold. The third modulation is configured to decrease the loudness of the second subset of the audio components less than a designated threshold amount.

In a first aspect of this embodiment, the first modulation is configured to compress the audio content more than the upper threshold compression amount in a designated frequency range in a passband of the speaker. The passband of a speaker is the range of frequencies in the audible frequency spectrum that the speaker is capable of reproducing. In one example, the designated frequency range is a range of frequencies between a lowest resonant frequency of the speaker and a highest resonant frequency of the speaker. In another example, the designated frequency range is a range of frequencies over which a frequency response of the speaker is greater than or equal to −3 dB relative to 1 kHz. In yet another example, the designated frequency range is a range of frequencies over which the frequency response of the speaker is greater than or equal to −6 dB relative to 1 kHz. In still another example, the designated frequency range extends from 1 kilohertz (kHz) to 8 kHz. It will be recognized that frequencies outside the designated frequency range may be amplified by a designated amount. The designated amount may be greater than or equal to 3 decibels (dB), 10 dB, or 20 dB. In accordance with this aspect, the upper threshold compression amount is greater than or equal to 1.4. For instance, the upper threshold compression amount may be greater than or equal to 1.6, 2.0, 2.2, or 2.4. In further accordance with this aspect, the first modulation is further configured to use automatic gain control (AGC) to change the loudness of the audio content to be substantially equal to a target (e.g., predetermined) loudness in the designated frequency range in response to the audio content being compressed. It will be recognized that each of an attack time and a decay time of the AGC may be set to any suitable value.

In a second aspect of this embodiment, each audio component in a designated subset of the audio components has a loudness that is less than a designated loudness threshold, and each audio component in a specified subset of the audio components has a loudness that is greater than or equal to a specified loudness threshold. The designated loudness threshold and the specified loudness threshold may be same or different. For instance, the specified loudness threshold may be greater than the designated loudness threshold.

In an example implementation, the first modulation is configured to compress the audio content by increasing loudness of the designated subset of the audio components based at least in part on each audio component in the designated subset having a loudness that is less than the designated loudness threshold. The first modulation may be configured to compress the audio content not by decreasing loudness of the specified subset of the audio components based at least in part on each audio component in the specified subset having a loudness that is greater than or equal to the designated loudness threshold.

In another example implementation, the first modulation is configured to compress the audio content by decreasing loudness of the specified subset of the audio components based at least in part on each audio component in the specified subset having a loudness that is greater than or equal to the specified loudness threshold. The first modulation may be configured to compress the audio content not by increasing loudness of the designated subset of the audio components based at least in part on each audio component in the designated subset having a loudness that is less than the specified loudness threshold.

In yet another example implementation, the first modulation is configured to compress the audio content by increasing loudness of the designated subset of the audio components and by decreasing loudness of the specified subset of the audio components based at least in part on each audio component in the designated subset having a loudness that is less than the designated loudness threshold and further based at least in part on each audio component in the specified subset having a loudness that is greater than or equal to the specified loudness threshold.

In each of these example implementations, the first modulation may be configured to cause a difference between the loudness of the designated subset of the audio components and the loudness of the specified subset of the audio components to be less than or equal to 3 dB, less than 2 dB, or less than 1 dB. The difference may be calculated using a relatively long time-average of the loudness of the designated subset of the audio components and a relatively long time-average of the loudness of the specified subset of the audio components. Each relatively long time-average may be a time-average over at least one second.

In a third aspect of this embodiment, the second modulation is configured to compress the audio content less than the lower threshold compression amount in a designated frequency range in the passband of the speaker. For instance, the second modulation may be configured to not compress the audio content in the designated frequency range. In one example, the designated frequency range is a range of frequencies between a lowest resonant frequency of the speaker and a highest resonant frequency of the speaker. In another example, the designated frequency range is a range of frequencies over which a frequency response of the speaker is greater than or equal to −3 dB relative to 1 kHz. In yet another example, the designated frequency range is a range of frequencies over which the frequency response of the speaker is greater than or equal to −6 dB relative to 1 kHz. In still another example, the designated frequency range extends from 1 kilohertz (kHz) to 8 kHz. In accordance with this aspect, the lower threshold compression amount is less than or equal to 1.4. For instance, the lower threshold compression amount is less than or equal to 1.2, 1.0, 0.8, or 0.6.

In a fourth aspect of this embodiment, the third modulation is configured to not change the loudness of the second subset of the audio components based at least in part on each audio component in the second subset having a loudness that is greater than or equal to the lower loudness threshold.

In some example embodiments, one or more steps 302, 304, 306, 308, 310, 312, 314, 316, and/or 318 of flowchart 300 may not be performed. Moreover, steps in addition to or in lieu of steps 302, 304, 306, 308, 310, 312, 314, 316, and/or 318 may be performed. For instance, in an example embodiment, the method of flowchart 300 further includes analyzing an audio profile of the audio content. In an example implementation, the selection logic 736 analyzes the audio profile. The audio profile indicates one or more audio attributes of the audio content that identify (e.g., uniquely identify) the audio content. For example, the one or more attributes may distinguish the audio content from other audio content. In another example, one or more attributes may include a pre-determined mapping of a frequency response of the audio content to a loudness response of the audio content. In accordance with this embodiment, selecting the first modulation at step 310, selecting the second modulation at step 312, and/or selecting the third modulation at step 314 is further based on the one or more audio attributes that are indicated by the audio profile of the audio content. For instance, the upper loudness threshold described with respect to steps 304 and 306 and/or the threshold difference described with respect to step 308 may be based at least in part on the one or more audio attributes.

In another example embodiment, the method of flowchart 300 further includes analyzing a type of the audio content. For instance, the selection logic 736 may analyze the type of the audio content. Example types of audio content include but are not limited to movie, song, and conversation. In accordance with this embodiment, selecting the first modulation at step 310, selecting the second modulation at step 312, and/or selecting the third modulation at step 314 is further based on the type of the audio content.

In yet another example embodiment, the method of flowchart 300 further includes determining a type of device that includes the speaker. In an example implementation, the selection logic 736 determines the type of the device. For instance, the type of the device may indicate a frequency response (e.g., transfer function) of the speaker. In accordance with this embodiment, selecting the first modulation at step 310, selecting the second modulation at step 312, and/or selecting the third modulation at step 314 is further based on the type of the device that includes the speaker.

In still another example embodiment, the method of flowchart 300 further includes sampling multiple frequency bands of each of the audio content and the background noise. For instance, the determination logic 732 may sample the frequency bands of each of the audio content and the background noise. In accordance with this embodiment, steps 302; 304; 306; 308; 310, 312, or 314; 316; and 318 are performed for each of the frequency bands.

In another example embodiment, the method of flowchart 300 further includes sampling the audio content and the background noise periodically at multiple time instances corresponding to respective time periods. For instance, the selection logic 736 may sample the audio content and the background noise periodically at the time instances. In accordance with this embodiment, a duration of each time period is tunable such that the duration of each time period increases as a rate at which the loudness of the background noise changes decreases and further such that the duration of each time period decreases as the rate at which the loudness of the background noise changes increases. In further accordance with this embodiment, steps 302; 304; 306; 308; 310, 312, or 314; 316; and 318 are performed for each of the time periods.

In yet another example embodiment, the method of flowchart 300 further includes analyzing a loudness profile of a software application with which the audio content is associated. For instance, the selection logic 736 may analyze the loudness profile of the software application. The loudness profile indicates multiple loudness values that are targeted by the software application for respective frequencies in audio content that is processed by the software application. In accordance with this embodiment, selecting the first modulation at step 310, selecting the second modulation at step 312, and/or selecting the third modulation at step 314 is further based on the loudness settings that are indicated by the loudness profile of the software application.

In still another example embodiment, the method of flowchart 300 further includes sampling the audio content and the background noise periodically over multiple time periods while a software application with which the audio content is associated is in use. In an example implementation, the selection logic 736 samples the audio content and the background noise periodically over the time periods while the software application is in use. For instance, sampling the audio content and the background noise may be performed at multiple time instances that correspond to the respective time periods based at least in part on the loudness of the audio content being less than a specified loudness threshold at the respective time instances. The time instances may occur during relatively quiet parts of the audio content, such as when no persons are speaking or during a transition from one song to another song. In accordance with this embodiment, steps 302; 304; 306; 308; 310, 312, or 314; 316; and 318 are performed for each of the time periods.

Figure 4:
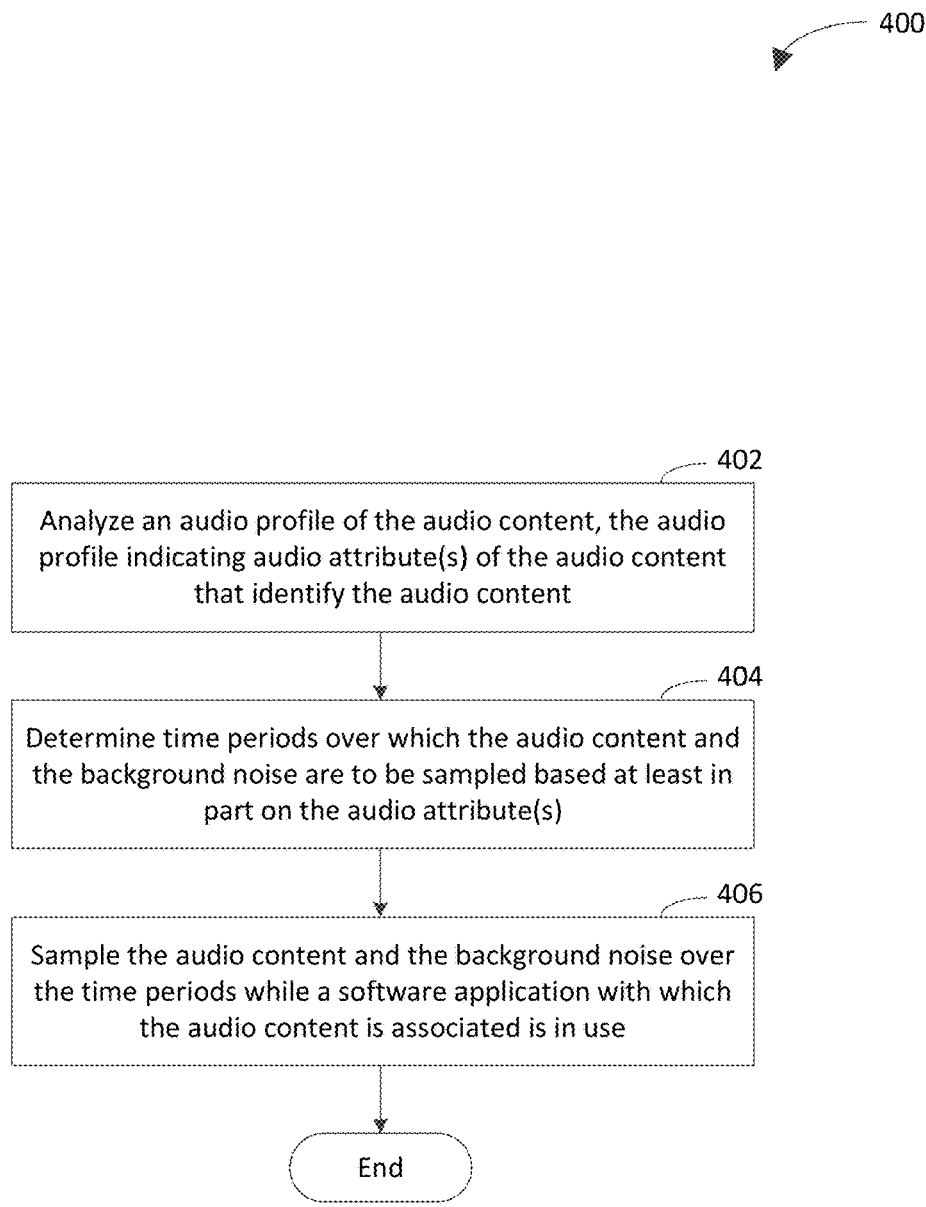

In another example embodiment, the method of flowchart 300 includes one or more of the steps shown in the flowchart 400 of FIG. 4. As shown in FIG. 4, the method of flowchart 400 begins at step 402. In step 402, an audio profile of the audio content is analyzed. The audio profile indicates audio attribute(s) of the audio content that identify the audio content. In an example implementation, the determination logic 732 analyzes the audio profile.

At step 404, time periods over which the audio content and the background noise are to be sampled are determined based at least in part on the audio attribute(s). In an example implementation, the determination logic 732 determines the time periods.

At step 406, the audio content and the background noise are sampled (e.g., periodically or continuously) over the time periods while a software application with which the audio content is associated is in use. In an example implementation, the determination logic 732 samples the audio content and the background noise over the time periods.

In yet another example embodiment, the loudness of the audio content is set based at least in part on the audio profile of the audio content. For instance, the audio profile may be used to define the loudness of the audio content.

In accordance with the embodiment of FIG. 4, steps 302; 304; 306; 308; 310, 312, or 314; 316; and 318 of flowchart 300 are performed for each of the time periods.

Figure 5:
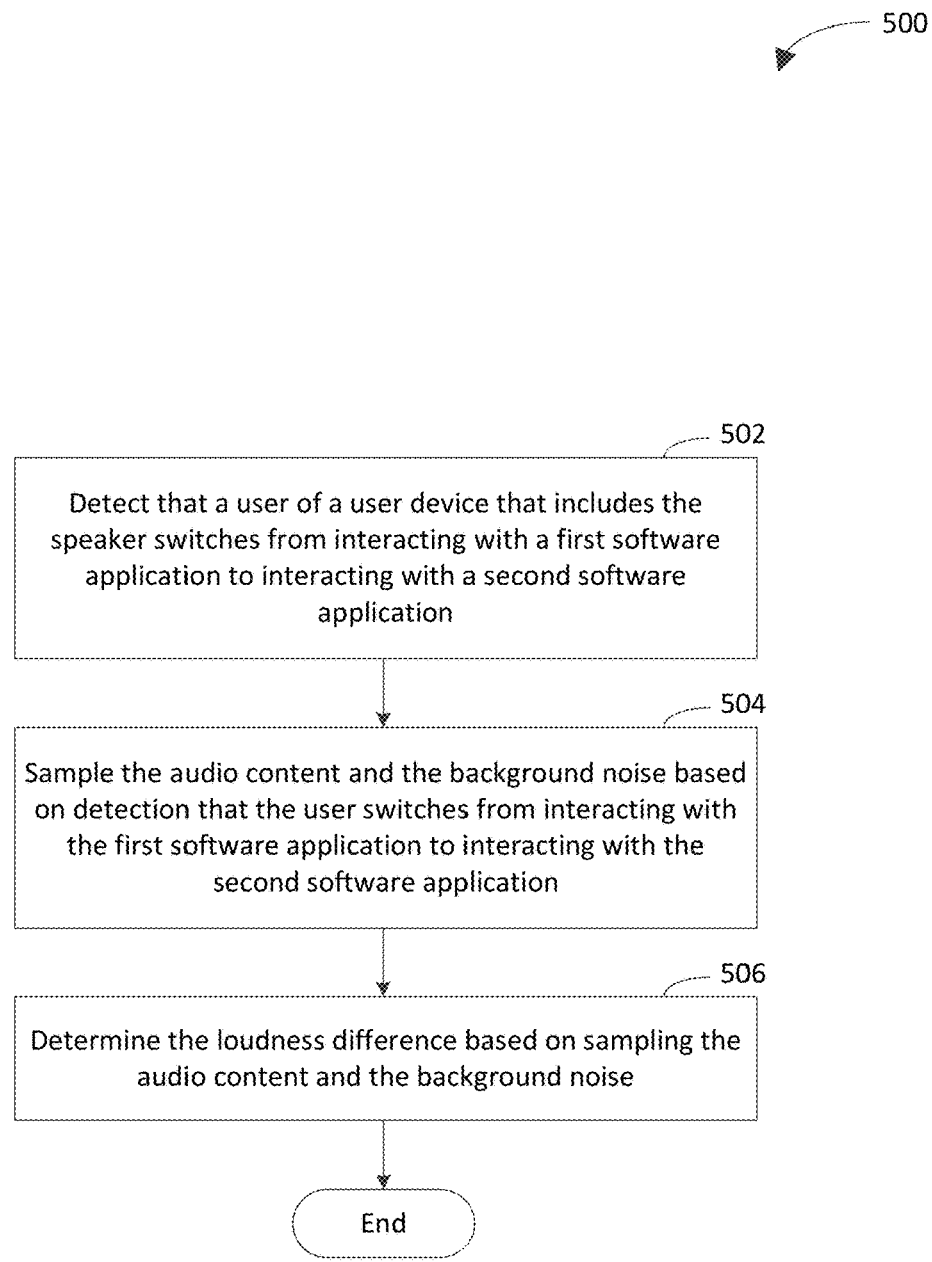

In still another example embodiment, step 302 of flowchart 300 may be replaced with one or more of the steps shown in the flowchart 500 of FIG. 5. As shown in FIG. 5, the method of flowchart 500 begins at step 502. In step 502, it is detected that a user of a user device that includes the speaker switches from interacting with a first software application to interacting with a second software application. In an example implementation, the determination logic 732 detects that the user of the user device switches from interacting with the first software application to interacting with the second software application.

At step 504, the audio content and the background noise are sampled based at least in part on detection that the user switches from interacting with the first software application to interacting with the second software application. For instance, the user switching from interacting with the first software application to interacting with the second software application may trigger sampling of the audio content and the background noise. In an example implementation, the determination logic 732 samples the audio content and the background noise based at least in part on the detection.

At step 506, the loudness difference is determined based at least in part on the audio content and the background noise being sampled. In an example embodiment, the determination logic 732 determines the loudness difference.

Figure 6:
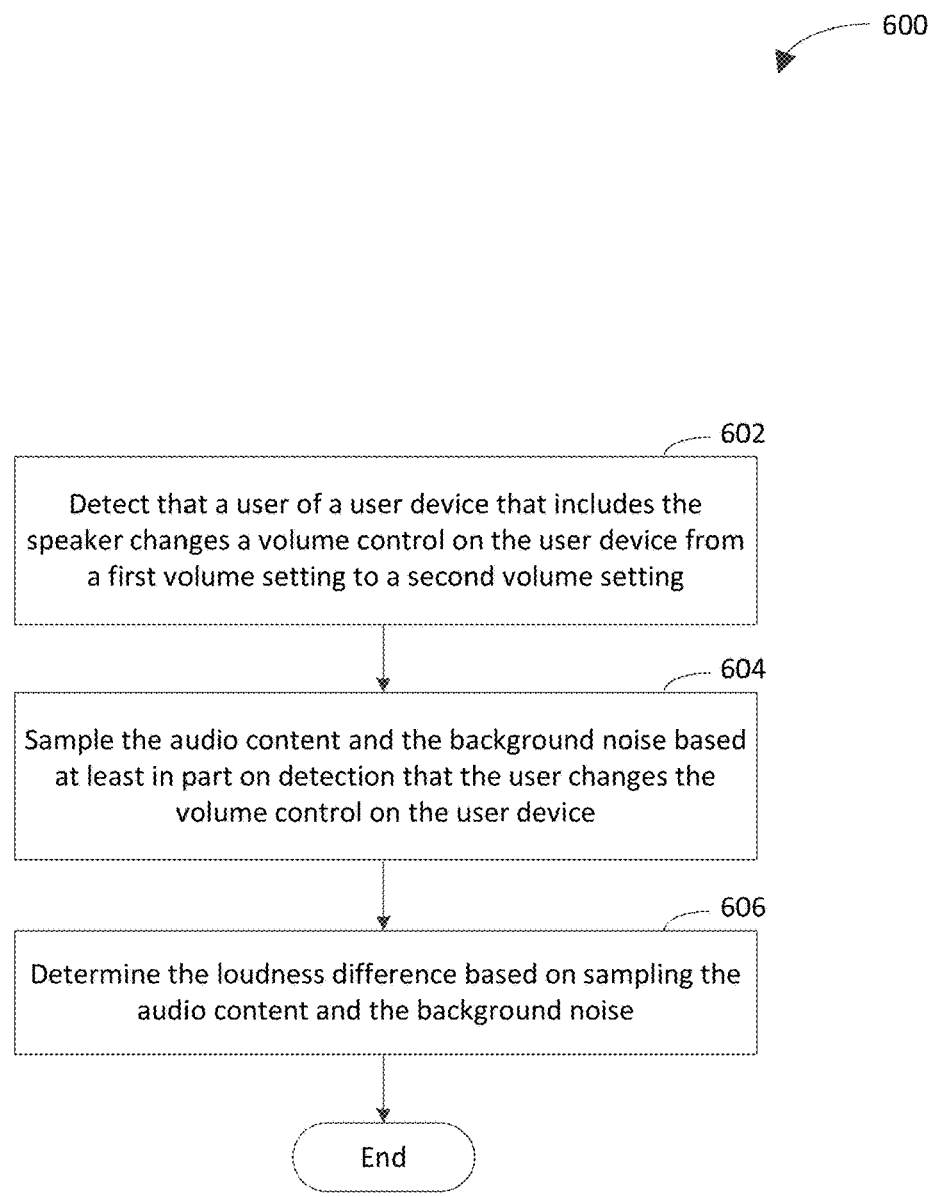

In another example embodiment, step 302 of flowchart 300 may be replaced with one or more of the steps shown in the flowchart 600 of FIG. 6. As shown in FIG. 6, the method of flowchart 600 begins at step 602. In step 602, it is detected that a user of a user device that includes the speaker changes a volume control on the user device from a first volume setting to a second volume setting. In an example implementation, the determination logic 732 detects that the user of the user device changes the volume control on the user device from the first volume setting to the second volume setting.

At step 604, the audio content and the background noise are sampled based at least in part on detection that the user changes the volume control on the user device. For instance, the user changing the volume control on the user device may trigger sampling of the audio content and the background noise. In an example implementation, the determination logic 732 samples the audio content and the background noise based at least in part on the detection.

At step 606, the loudness difference is determined based at least in part on the audio content and the background noise being sampled. In an example embodiment, the determination logic 732 determines the loudness difference.

It will be recognized that the adaptive modulator 700 may not include one or more of the determination logic 732, the comparison logic 734, the selection logic 736, and/or the modulation logic 738. Furthermore, the adaptive modulator 700 may include components in addition to or in lieu of the determination logic 732, the comparison logic 734, the selection logic 736, and/or the modulation logic 738.

Figure 8:
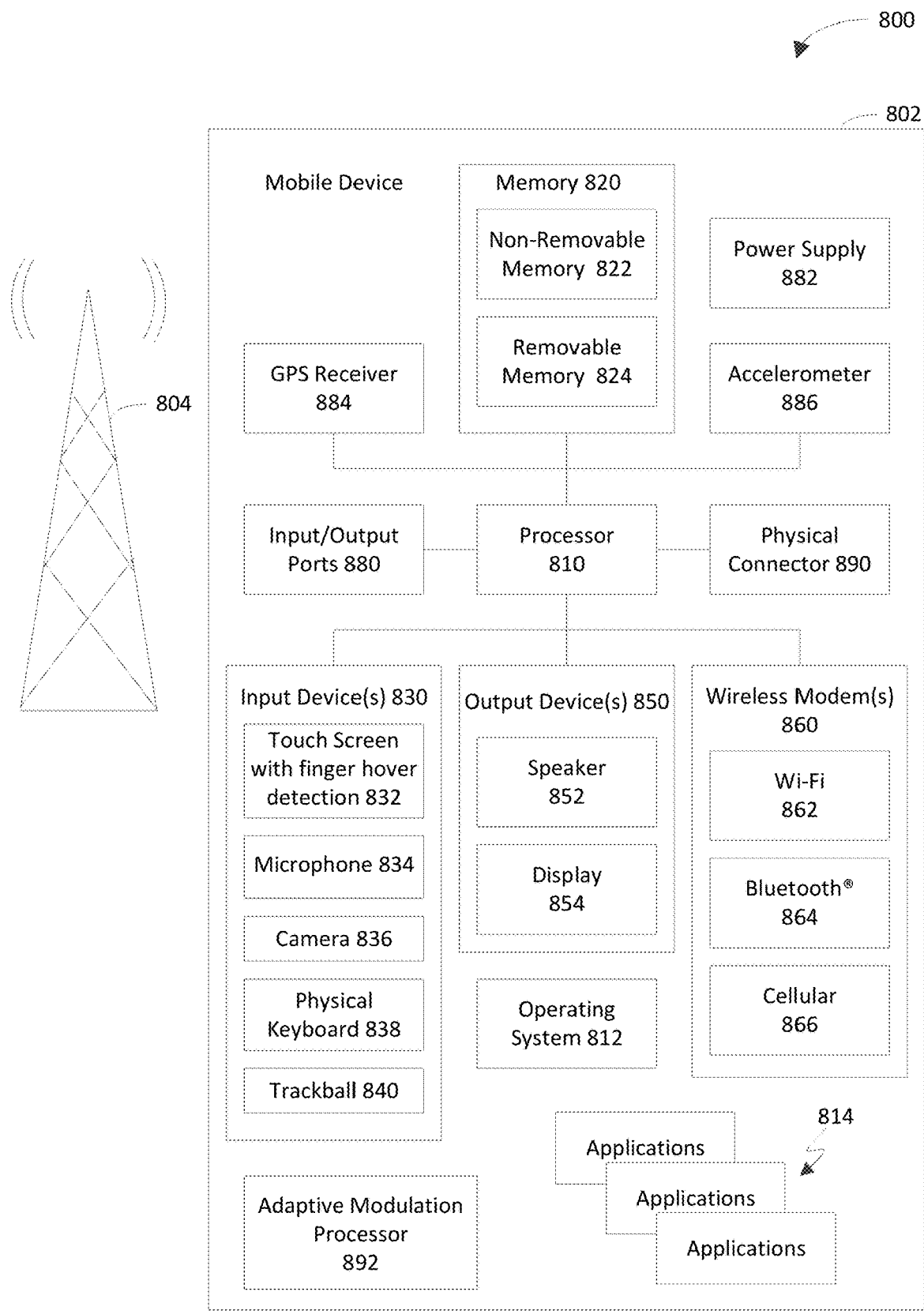
FIG. 8 is a system diagram of an exemplary mobile device in accordance with an embodiment.

FIG. 8 is a system diagram of an exemplary mobile device 800 including a variety of optional hardware and software components, shown generally as 802. Any components 802 in the mobile device may communicate with any other component, though not all connections are shown, for ease of illustration. The mobile device 800 may be any of a variety of computing devices (e.g., cell phone, smartphone, handheld computer, Personal Digital Assistant (PDA), etc.) and may allow wireless two-way communications with one or more mobile communications networks 804, such as a cellular or satellite network, or with a local area or wide area network.

The mobile device 800 may include a processor 810 (e.g., signal processor, microprocessor, ASIC, or other control and processing logic circuitry) for performing such tasks as signal coding, data processing, input/output processing, power control, and/or other functions. An operating system 812 may control the allocation and usage of the components 802 and support for one or more applications 814 (a.k.a. application programs). The applications 814 may include common mobile computing applications (e.g., email applications, calendars, contact managers, web browsers, messaging applications) and any other computing applications (e.g., word processing applications, mapping applications, media player applications).

The mobile device 800 may include memory 820. The memory 820 may include non-removable memory 822 and/or removable memory 824. The non-removable memory 822 may include RAM, ROM, flash memory, a hard disk, or other well-known memory storage technologies. The removable memory 824 may include flash memory or a Subscriber Identity Module (SIM) card, which is well known in GSM communication systems, or other well-known memory storage technologies, such as "smart cards." The memory 820 may store data and/or code for running the operating system 812 and the applications 814. Example data may include web pages, text, images, sound files, video data, or other data sets to be sent to and/or received from one or more network servers or other devices via one or more wired or wireless networks. Memory 820 may store a subscriber identifier, such as an International Mobile Subscriber Identity (IMSI), and an equipment identifier, such as an International Mobile Equipment Identifier (IMEI). Such identifiers may be transmitted to a network server to identify users and equipment.

The mobile device 800 may support one or more input devices 830, such as a touch screen 832, microphone 834, camera 836, physical keyboard 838 and/or trackball 840 and one or more output devices 850, such as a speaker 852 and a display 854. Touch screens, such as the touch screen 832, may detect input in different ways. For example, capacitive touch screens detect touch input when an object (e.g., a fingertip) distorts or interrupts an electrical current running across the surface. As another example, touch screens may use optical sensors to detect touch input when beams from the optical sensors are interrupted. Physical contact with the surface of the screen is not necessary for input to be detected by some touch screens. For example, the touch screen 832 may support a finger hover detection using capacitive sensing, as is well understood in the art. Other detection techniques may be used, including but not limited to camera-based detection and ultrasonic-based detection. To implement a finger hover, a user's finger is typically within a predetermined spaced distance above the touch screen, such as between 0.1 to 0.25 inches, or between 0.25 inches and 0.5 inches, or between 0.5 inches and 0.75 inches, or between 0.75 inches and 1 inch, or between 1 inch and 1.5 inches, etc.

The mobile device 800 may include an adaptive modulation processor 892. The adaptive modulation processor 892 is configured to adaptively modulate audio content based on background noise in accordance with any one or more of the techniques described herein.

Other possible output devices (not shown) may include piezoelectric or other haptic output devices. Some devices may serve more than one input/output function. For example, touch screen 832 and display 854 may be combined in a single input/output device. The input devices 830 may include a Natural User Interface (NUI). An NUI is any interface technology that enables a user to interact with a device in a "natural" manner, free from artificial constraints imposed by input devices such as mice, keyboards, remote controls, and the like. Examples of NUI methods include those relying on speech recognition, touch and stylus recognition, gesture recognition both on screen and adjacent to the screen, air gestures, head and eye tracking, voice and speech, vision, touch, gestures, and machine intelligence. Other examples of a NUI include motion gesture detection using accelerometers/gyroscopes, facial recognition, 3D displays, head, eye, and gaze tracking, immersive augmented reality and virtual reality systems, all of which provide a more natural interface, as well as technologies for sensing brain activity using electric field sensing electrodes (EEG and related methods). Thus, in one specific example, the operating system 812 or applications 814 may include speech-recognition software as part of a voice control interface that allows a user to operate the mobile device 800 via voice commands. Furthermore, the mobile device 800 may include input devices and software that allows for user interaction via a user's spatial gestures, such as detecting and interpreting gestures to provide input to a gaming application.

Wireless modem(s) 860 may be coupled to antenna(s) (not shown) and may support two-way communications between the processor 810 and external devices, as is well understood in the art. The modem(s) 860 are shown generically and may include a cellular modem 866 for communicating with the mobile communication network 804 and/or other radio-based modems (e.g., Bluetooth® 864 and/or Wi-Fi 862). At least one of the wireless modem(s) 860 is typically configured for communication with one or more cellular networks, such as a GSM network for data and voice communications within a single cellular network, between cellular networks, or between the mobile device and a public switched telephone network (PSTN).

The mobile device may further include at least one input/output port 880, a power supply 882, a satellite navigation system receiver 884, such as a Global Positioning System (GPS) receiver, an accelerometer 886, and/or a physical connector 890, which may be a USB port, IEEE 1394 (FireWire) port, and/or RS-232 port. The illustrated components 802 are not required or all-inclusive, as any components may be deleted and other components may be added as would be recognized by one skilled in the art.

Although the operations of some of the disclosed methods are described in a particular, sequential order for convenient presentation, it should be understood that this manner of description encompasses rearrangement, unless a particular ordering is required by specific language set forth herein. For example, operations described sequentially may in some cases be rearranged or performed concurrently. Moreover, for the sake of simplicity, the attached figures may not show the various ways in which the disclosed methods may be used in conjunction with other methods.

Any one or more of the adaptive modulation processor 104, echo canceller 112, long-term level analyzer 114, adaptive modulator 116, dynamic range analyzer 118, DAC 106, amplifier 108, adaptive modulator 700, determination logic 732, comparison logic 734, selection logic 736, modulation logic 738, flowchart 300, flowchart 400, flowchart 500, and/or flowchart 600 may be implemented in hardware, software, firmware, or any combination thereof.

For example, any one or more of the adaptive modulation processor 104, echo canceller 112, long-term level analyzer 114, adaptive modulator 116, dynamic range analyzer 118, DAC 106, amplifier 108, adaptive modulator 700, determination logic 732, comparison logic 734, selection logic 736, modulation logic 738, flowchart 300, flowchart 400, flowchart 500, and/or flowchart 600 may be implemented, at least in part, as computer program code configured to be executed in one or more processors.

In another example, any one or more of the adaptive modulation processor 104, echo canceller 112, long-term level analyzer 114, adaptive modulator 116, dynamic range analyzer 118, DAC 106, amplifier 108, adaptive modulator 700, determination logic 732, comparison logic 734, selection logic 736, modulation logic 738, flowchart 300, flowchart 400, flowchart 500, and/or flowchart 600 may be implemented, at least in part, as hardware logic/electrical circuitry. Such hardware logic/electrical circuitry may include one or more hardware logic components. Examples of a hardware logic component include but are not limited to a field-programmable gate array (FPGA), an application-specific integrated circuit (ASIC), an application-specific standard product (ASSP), a system-on-a-chip system (SoC), a complex programmable logic device (CPLD), etc. For instance, a SoC may include an integrated circuit chip that includes one or more of a processor (e.g., a microcontroller, microprocessor, digital signal processor (DSP), etc.), memory, one or more communication interfaces, and/or further circuits and/or embedded firmware to perform its functions.

Figure 7:
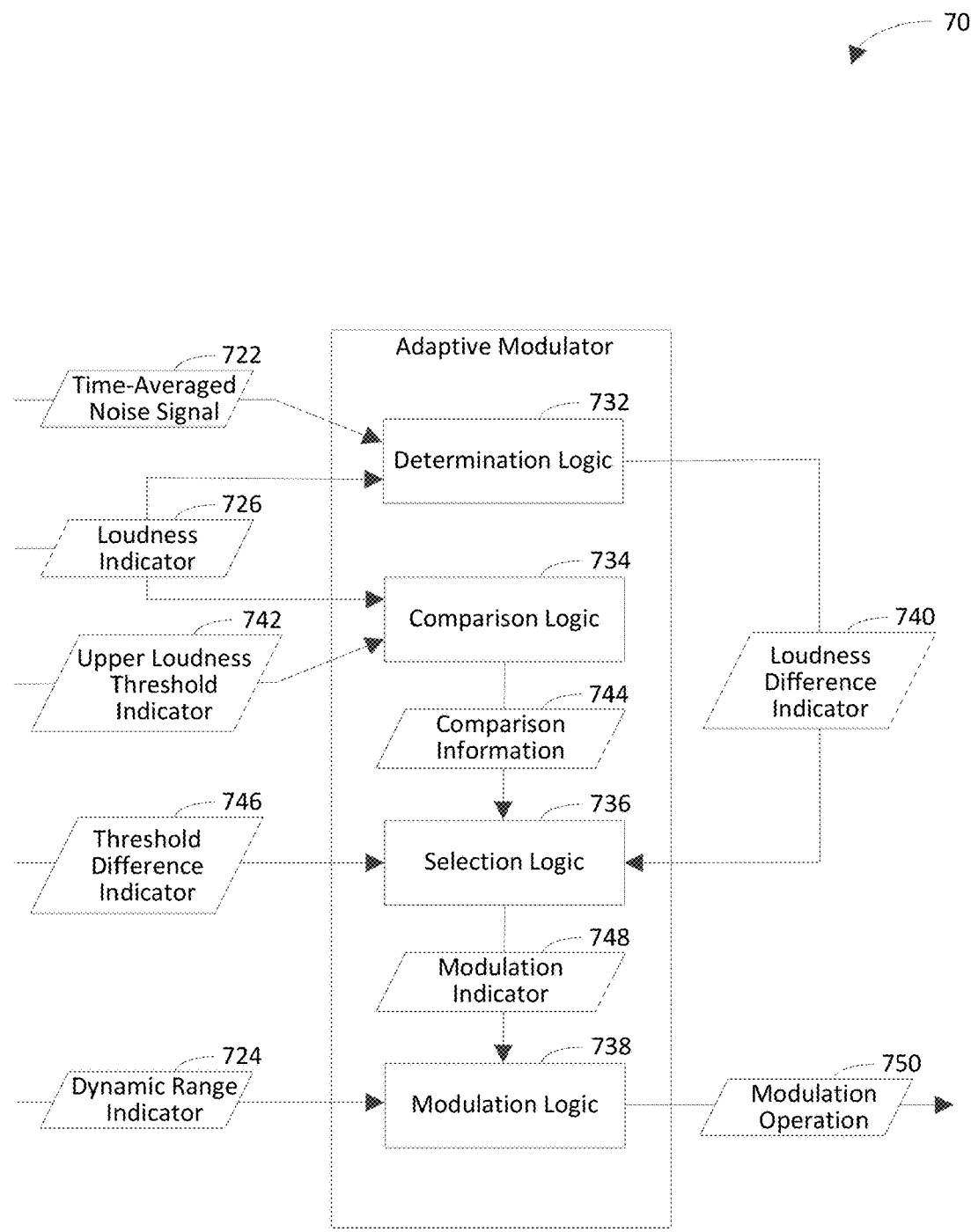
FIG. 7 is a block diagram of an example implementation of an adaptive modulator shown in FIG. 1 in accordance with an embodiment.

III. Further Discussion of Some Example Embodiments (A1) An example electronic device (FIG. 1, 100; FIG. 8, 800; FIG. 8, 800) comprises a speaker (FIG. 1, 110), a microphone (FIG. 1, 102), and a controller (FIG. 1, 104; FIG. 7, 700; FIG. 8, 892). The speaker is configured to output audio content (FIG. 1, 130). The microphone is configured to receive background noise (FIG. 1, 120) and the audio content. The controller is coupled to the speaker and the microphone. The controller is configured to determine (FIG. 3, 302) a loudness difference between a loudness of the audio content and a loudness of the background noise. The controller is further configured to compare (FIG. 3, 304) the loudness of the audio content to an upper loudness threshold. The controller is further configured to select (FIG. 3, 310, 312, or 314) a modulation from a plurality of modulations based on at least one of the loudness difference or the comparison. A first modulation is to be selected in accordance with the loudness difference being less than a threshold difference and the loudness of the audio content being less than the upper loudness threshold. A second modulation is to be selected in accordance with the loudness difference being greater than or equal to the threshold difference and the loudness of the audio content being less than the upper loudness threshold. A third modulation is to be selected in accordance with the loudness of the audio content being greater than or equal to the upper loudness threshold. The controller is further configured to modulate (FIG. 3, 316) subsequent outputted audio content using the selected modulation.

(A2) In the electronic device of A1, wherein the audio content includes a plurality of audio components that correspond to a plurality of respective frequencies; wherein the first modulation is configured to compress the audio content more than an upper threshold compression amount; wherein the second modulation is configured to compress the audio content less than a lower threshold compression amount that is less than or equal to the upper threshold compression amount; and wherein the third modulation is configured to increase loudness of a first subset of the audio components, and to decrease loudness of a second subset of the audio components less than a designated threshold amount, based on each audio component in the first subset having a loudness that is less than a lower loudness threshold and further based on each audio component in the second subset having a loudness that is greater than or equal to the lower loudness threshold.

(A3) In the electronic device of any of A1-A2, wherein the first modulation is further configured to use automatic gain control to change the loudness of the audio content to be substantially equal to a target loudness in a designated frequency range in a passband of the speaker in response to the audio content being compressed.

(A4) In the electronic device of any of A1-A3, wherein the first modulation is configured to compress the audio content more than the upper threshold compression amount in a designated frequency range in a passband of the speaker; and wherein the upper threshold compression amount is greater than or equal to 1.4.

(A5) In the electronic device of any of A1-A4, wherein the upper threshold compression amount is greater than or equal to 2.0.

(A6) The electronic device of any of A1-A5, wherein the second modulation is configured to compress the audio content less than the lower threshold compression amount in a designated frequency range in a passband of the speaker; and wherein the lower threshold compression amount is less than or equal to 1.4.

(A7) The electronic device of any of A1-A6, wherein the lower threshold compression amount is less than or equal to 1.2.

(A8) The electronic device of any of A1-A7, wherein the second modulation is configured to not compress the audio content in a designated frequency range in a passband of the speaker.

(A9) The electronic device of any of A1-A8, wherein the third modulation is configured to not change the loudness of the second subset of the audio components based at least in part on each audio component in the second subset having a loudness that is greater than or equal to the lower loudness threshold.

(A10) The electronic device of any of A1-A9, wherein the first modulation is configured to compress the audio content by increasing loudness of a designated subset of the audio components based at least in part on each audio component in the designated subset having a loudness that is less than a designated loudness threshold.

(A11) The electronic device of any of A1-A10, wherein the first modulation is configured to compress the audio content by decreasing loudness of a specified subset of the audio components based at least in part on each audio component in the specified subset having a loudness that is greater than or equal to a specified loudness threshold.

(A12) The electronic device of any of A1-A11, wherein the first modulation is configured to compress the audio content by increasing loudness of a designated subset of the audio components and by decreasing loudness of a specified subset of the audio components based at least in part on each audio component in the designated subset having a loudness that is less than a designated loudness threshold and further based at least in part on each audio component in the specified subset having a loudness that is greater than or equal to a specified loudness threshold.

(A13) The electronic device of any of A1-A12, wherein the controller is configured to: analyze an audio profile of the audio content, the audio profile indicating one or more audio attributes of the audio content that identify the audio content; and select the modulation further based on the one or more audio attributes that are indicated by the audio profile of the audio content.

(A14) The electronic device of any of A1-A13, wherein the controller is configured to: analyze a type of the audio content; and select the modulation further based on the type of the audio content.

(A15) The electronic device of any of A1-A14, wherein the controller is configured to: determine a type of the electronic device; and select the modulation further based on the type of the electronic device.

(A16) The electronic device of any of A1-A15, wherein the controller is configured to: sample the audio content and the background noise periodically over a plurality of time periods while a software application with which the audio content is associated is in use; and determine the loudness difference, compare the loudness of the audio content to the upper loudness threshold, select the modulation, and modulate the subsequent outputted audio content for each of the plurality of time periods.

(A17) The electronic device of any of A1-A16, wherein the controller is further configured to: analyze an audio profile of audio content, the audio profile indicating one or more audio attributes of the audio content that identify the audio content; and determine the plurality of time periods over which the audio content and the background noise are to be sampled based at least in part on the one or more audio attributes that are indicated by the audio profile of the audio content.

(A18) The electronic device of any of A1-A17, wherein the controller is configured to: sample the audio content and the background noise at a plurality of time instances that correspond to the plurality of respective time periods based at least in part on the loudness of the audio content being less than a specified loudness threshold at the plurality of respective time instances.

(A19) The electronic device of any of A1-A18, wherein the controller is configured to: sample a plurality of frequency bands of each of the audio content and the background noise; and determine the loudness difference, compare the loudness of the audio content to the upper loudness threshold, select the modulation, and modulate the subsequent outputted audio content for each frequency band of the plurality of frequency bands.

(A20) The electronic device of any of A1-A19, wherein the controller is configured to: detect that a user of the electronic device switches from interacting with a first software application to interacting with a second software application; sample the audio content and the background noise based on detection that the user switches from interacting with the first software application to interacting with the second software application; and determine the loudness difference based on the audio content and the background noise being sampled.

(A21) The electronic device of any of A1-A20, wherein the controller is configured to: detect that a user of the electronic device changes a volume control on the electronic device from a first volume setting to a second volume setting; sample the audio content and the background noise based at least in part on detection that the user changes the volume control on the electronic device; and determine the loudness difference based on the audio content and the background noise being sampled.

(A22) The electronic device of any of A1-A21, wherein the controller is configured to: sample the audio content and the background noise periodically at a plurality of time instances corresponding to a plurality of respective time periods, wherein a duration of each time period is tunable such that the duration of each time period increases as a rate at which the loudness of the background noise changes decreases and further such that the duration of each time period decreases as the rate at which the loudness of the background noise changes increases; and determine the loudness difference, compare the loudness of the audio content to the upper loudness threshold, select the modulation, and modulate the subsequent outputted audio content for each of the plurality of time periods.

(A23) The electronic device of any of A1-A22, wherein the controller is configured to: analyze a loudness profile of a software application with which the audio content is associated, the loudness profile indicating a plurality of loudness values that are targeted by the software application for a plurality of respective frequencies in audio content that is processed by the software application; and select the modulation further based on the plurality of loudness settings that are indicated by the loudness profile of the software application.

(A24) The electronic device of any of A1-A23, wherein the controller is configured to: analyze an audio profile of the audio content, the audio profile indicating one or more audio attributes of the audio content that identify the audio content; and select the modulation to set a loudness of the audio content such that the loudness of the audio content is based at least in part on the one or more audio attributes that are indicated by the audio profile of the audio content.

(B1) A method (FIG. 3, 300) comprises: determining (FIG. 3, 302) a loudness difference between a loudness of audio content (FIG. 1, 130) that is outputted by a speaker (FIG. 1, 110) and a loudness of background noise (FIG. 1, 120); comparing (FIG. 3, 304) the loudness of the audio content to an upper loudness threshold; selecting (FIG. 3, 310, 312, or 314) a modulation from a plurality of modulations based on at least one of the loudness difference or the comparison, wherein a first modulation is to be selected in accordance with the loudness difference being less than a threshold difference and the loudness of the audio content being less than the upper loudness threshold, wherein a second modulation is to be selected in accordance with the loudness difference being greater than or equal to the threshold difference and the loudness of the audio content being less than the upper loudness threshold, and wherein a third modulation is to be selected in accordance with the loudness of the audio content being greater than or equal to the upper loudness threshold; and modulating (FIG. 3, 316) subsequent outputted audio content using the selected modulation.

(B2) In the method of B1, wherein the audio content includes a plurality of audio components that correspond to a plurality of respective frequencies; wherein the first modulation is configured to compress the audio content more than an upper threshold compression amount; wherein the second modulation is configured to compress the audio content less than a lower threshold compression amount that is less than or equal to the upper threshold compression amount; and wherein the third modulation is configured to increase loudness of a first subset of the audio components, and to decrease loudness of a second subset of the audio components less than a designated threshold amount, based on each audio component in the first subset having a loudness that is less than a lower loudness threshold and further based on each audio component in the second subset having a loudness that is greater than or equal to the lower loudness threshold.

(B3) In the method of any of B1-B2, wherein the first modulation is further configured to use automatic gain control to change the loudness of the audio content to be substantially equal to a target loudness in a designated frequency range in a passband of the speaker in response to the audio content being compressed.

(B4) In the method of any of B1-B3, wherein the first modulation is configured to compress the audio content more than the upper threshold compression amount in a designated frequency range in a passband of the speaker; and wherein the upper threshold compression amount is greater than or equal to 1.4.

(B5) In the method of any of B1-B4, wherein the upper threshold compression amount is greater than or equal to 2.0.

(B6) In the method of any of B1-B5, wherein the second modulation is configured to compress the audio content less than the lower threshold compression amount in a designated frequency range in a passband of the speaker; and wherein the lower threshold compression amount is less than or equal to 1.4.

(B7) In the method of any of B1-B6, wherein the lower threshold compression amount is less than or equal to 1.2.

(B8) In the method of any of B1-B7, wherein the second modulation is configured to not compress the audio content in a designated frequency range in a passband of the speaker.

(B9) In the method of any of B1-B8, wherein the third modulation is configured to not change the loudness of the second subset of the audio components based at least in part on each audio component in the second subset having a loudness that is greater than or equal to the lower loudness threshold.

(B10) In the method of any of B1-B9, wherein the first modulation is configured to compress the audio content by increasing loudness of a designated subset of the audio components based at least in part on each audio component in the designated subset having a loudness that is less than a designated loudness threshold.

(B11) In the method of any of B1-B10, wherein the first modulation is configured to compress the audio content by decreasing loudness of a specified subset of the audio components based at least in part on each audio component in the specified subset having a loudness that is greater than or equal to a specified loudness threshold.

(B12) In the method of any of B1-B11, wherein the first modulation is configured to compress the audio content by increasing loudness of a designated subset of the audio components and by decreasing loudness of a specified subset of the audio components based at least in part on each audio component in the designated subset having a loudness that is less than a designated loudness threshold and further based at least in part on each audio component in the specified subset having a loudness that is greater than or equal to a specified loudness threshold.

(B13) In the method of any of B1-B12, further comprising: analyzing an audio profile of the audio content, the audio profile indicating one or more audio attributes of the audio content that identify the audio content; wherein selecting the modulation comprises selecting the modulation further based on the one or more audio attributes that are indicated by the audio profile of the audio content.

(B14) In the method of any of B1-B13, further comprising: analyzing a type of the audio content; wherein selecting the modulation comprises selecting the modulation further based on the type of the audio content.

(B15) In the method of any of B1-B14, further comprising: determining a type of device that includes the speaker; wherein selecting the modulation comprises selecting the modulation further based on the type of the device that includes the speaker.

(B16) In the method of any of B1-B15, further comprising: sampling the audio content and the background noise periodically over a plurality of time periods while a software application with which the audio content is associated is in use; wherein determining the loudness difference, comparing the loudness of the audio content to the upper loudness threshold, selecting the modulation, and modulating the subsequent outputted audio content are performed for each of the plurality of time periods.

(B17) In the method of any of B1-B16, further comprising: analyzing an audio profile of the audio content, the audio profile indicating one or more audio attributes of the audio content that identify the audio content; and determining the plurality of time periods over which the audio content and the background noise are to be sampled based at least in part on the one or more audio attributes that are indicated by the audio profile of the audio content.

(B18) In the method of any of B1-B17, wherein sampling the audio content and the background noise comprises: sampling the audio content and the background noise at a plurality of time instances that correspond to the plurality of respective time periods based at least in part on the loudness of the audio content being less than a specified loudness threshold at the plurality of respective time instances.

(B19) In the method of any of B1-B18, further comprising: sampling a plurality of frequency bands of each of the audio content and the background noise; wherein determining the loudness difference, comparing the loudness of the audio content to the upper loudness threshold, selecting the modulation, and modulating the subsequent outputted audio content are performed for each frequency band of the plurality of frequency bands.

(B20) In the method of any of B1-B19, further comprising: detecting that a user of a user device that includes the speaker switches from interacting with a first software application to interacting with a second software application; and sampling the audio content and the background noise based on detection that the user switches from interacting with the first software application to interacting with the second software application; wherein determining the loudness difference comprises determining the loudness difference based on sampling the audio content and the background noise.

(B21) In the method of any of B1-B20, further comprising: detecting that a user of a user device that includes the speaker changes a volume control on the user device from a first volume setting to a second volume setting; and sampling the audio content and the background noise based at least in part on detection that the user changes the volume control on the user device; wherein determining the loudness difference comprises determining the loudness difference based on sampling the audio content and the background noise.

(B22) In the method of any of B1-B21, further comprising: sampling the audio content and the background noise periodically at a plurality of time instances corresponding to a plurality of respective time periods; wherein a duration of each time period is tunable such that the duration of each time period increases as a rate at which the loudness of the background noise changes decreases and further such that the duration of each time period decreases as the rate at which the loudness of the background noise changes increases; and wherein determining the loudness difference, comparing the loudness of the audio content to the upper loudness threshold, selecting the modulation, and modulating the subsequent outputted audio content are performed for each of the plurality of time periods.

(B23) In the method of any of B1-B22, further comprising: analyzing a loudness profile of a software application with which the audio content is associated, the loudness profile indicating a plurality of loudness values that are targeted by the software application for a plurality of respective frequencies in audio content that is processed by the software application; wherein selecting the modulation comprises selecting the modulation further based on the plurality of loudness settings that are indicated by the loudness profile of the software application.

(B24) In the method of any of B1-B23, further comprising analyzing an audio profile of the audio content, the audio profile indicating one or more audio attributes of the audio content that identify the audio content; wherein selecting the modulation comprises selecting the modulation to set a loudness of the audio content such that the loudness of the audio content is based at least in part on the one or more audio attributes that are indicated by the audio profile of the audio content.

(C1) A computer program product comprising a computer-readable storage medium having instructions recorded thereon for enabling a processor-based system to perform operations, the operations comprising: determining a loudness difference between a loudness of audio content that is outputted by a speaker and a loudness of background noise; comparing the loudness of the audio content to an upper loudness threshold; selecting a modulation from a plurality of modulations based on at least one of the loudness difference or the comparison, wherein a first modulation is to be selected in accordance with the loudness difference being less than a threshold difference and the loudness of the audio content being less than the upper loudness threshold, wherein a second modulation is to be selected in accordance with the loudness difference being greater than or equal to the threshold difference and the loudness of the audio content being less than the upper loudness threshold, and wherein a third modulation is to be selected in accordance with the loudness of the audio content being greater than or equal to the upper loudness threshold; and modulating subsequent outputted audio content using the selected modulation.

IV. Example Computer System

Figure 9:
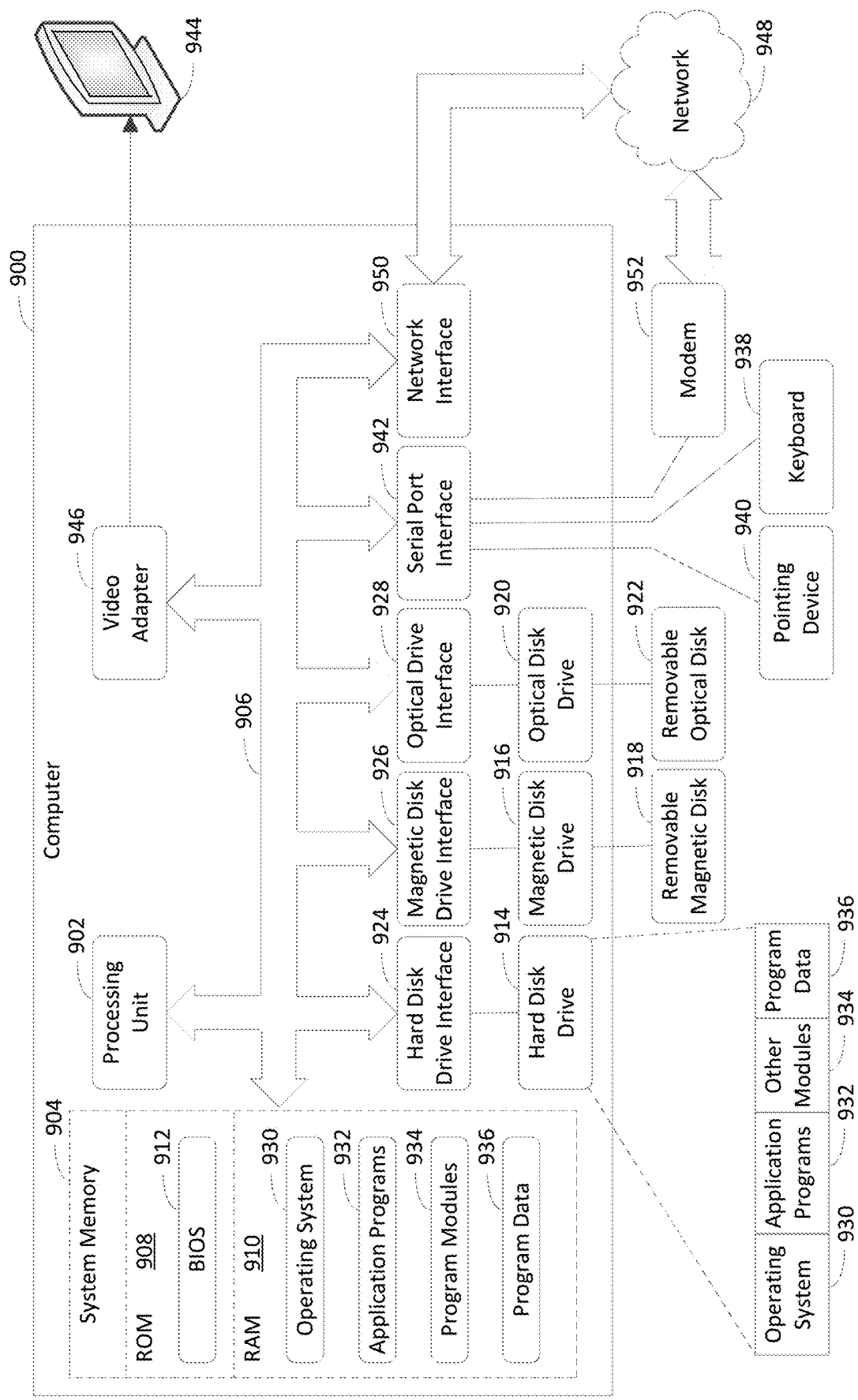
FIG. 9 depicts an example computer in which embodiments may be implemented.

FIG. 9 depicts an example computer 900 in which embodiments may be implemented. The electronic device 100 shown in FIG. 1 may be implemented using computer 900, including one or more features of computer 900 and/or alternative features. Computer 900 may be a general-purpose computing device in the form of a conventional personal computer, a mobile computer, or a workstation, for example, or computer 900 may be a special purpose computing device. The description of computer 900 provided herein is provided for purposes of illustration, and is not intended to be limiting. Embodiments may be implemented in further types of computer systems, as would be known to persons skilled in the relevant art(s).

As shown in FIG. 9, computer 900 includes a processing unit 902, a system memory 904, and a bus 906 that couples various system components including system memory 904 to processing unit 902. Bus 906 represents one or more of any of several types of bus structures, including a memory bus or memory controller, a peripheral bus, an accelerated graphics port, and a processor or local bus using any of a variety of bus architectures. System memory 904 includes read only memory (ROM) 908 and random access memory (RAM) 910. A basic input/output system 912 (BIOS) is stored in ROM 908.

Computer 900 also has one or more of the following drives: a hard disk drive 914 for reading from and writing to a hard disk, a magnetic disk drive 916 for reading from or writing to a removable magnetic disk 918, and an optical disk drive 920 for reading from or writing to a removable optical disk 922 such as a CD ROM, DVD ROM, or other optical media. Hard disk drive 914, magnetic disk drive 916, and optical disk drive 920 are connected to bus 906 by a hard disk drive interface 924, a magnetic disk drive interface 926, and an optical drive interface 928, respectively. The drives and their associated computer-readable storage media provide nonvolatile storage of computer-readable instructions, data structures, program modules and other data for the computer. Although a hard disk, a removable magnetic disk and a removable optical disk are described, other types of computer-readable storage media can be used to store data, such as flash memory cards, digital video disks, random access memories (RAMs), read only memories (ROM), and the like.

A number of program modules may be stored on the hard disk, magnetic disk, optical disk, ROM, or RAM. These programs include an operating system 930, one or more application programs 932, other program modules 934, and program data 936. Application programs 932 or program modules 934 may include, for example, computer program logic for implementing any one or more of (e.g., at least a portion of) the adaptive modulation processor 104, echo canceller 112, long-term level analyzer 114, adaptive modulator 116, dynamic range analyzer 118, amplifier 108, adaptive modulator 700, determination logic 732, comparison logic 734, selection logic 736, modulation logic 738, flowchart 300 (including any step of flowchart 300), flowchart 400 (including any step of flowchart 400), flowchart 500 (including any step of flowchart 500), and/or flowchart 600 (including any step of flowchart 600), as described herein.

A user may enter commands and information into the computer 900 through input devices such as keyboard 938 and pointing device 940. Other input devices (not shown) may include a microphone, joystick, game pad, satellite dish, scanner, touch screen, camera, accelerometer, gyroscope, or the like. These and other input devices are often connected to the processing unit 902 through a serial port interface 942 that is coupled to bus 906, but may be connected by other interfaces, such as a parallel port, game port, or a universal serial bus (USB).

A display device 944 (e.g., a monitor) is also connected to bus 906 via an interface, such as a video adapter 946. In addition to display device 944, computer 900 may include other peripheral output devices (not shown) such as speakers and printers.

Computer 900 is connected to a network 948 (e.g., the Internet) through a network interface or adapter 950, a modem 952, or other means for establishing communications over the network. Modem 952, which may be internal or external, is connected to bus 906 via serial port interface 942.

As used herein, the terms "computer program medium" and "computer-readable storage medium" are used to generally refer to media (e.g., non-transitory media) such as the hard disk associated with hard disk drive 914, removable magnetic disk 918, removable optical disk 922, as well as other media such as flash memory cards, digital video disks, random access memories (RAMs), read only memories (ROM), and the like. A computer-readable storage medium is not a signal, such as a carrier signal or a propagating signal. For instance, a computer-readable storage medium may not include a signal. Accordingly, a computer-readable storage medium does not constitute a signal per se. Computer-readable storage media are distinguished from and non-overlapping with communication media (do not include communication media). Communication media embodies computer-readable instructions, data structures, program modules or other data in a modulated data signal such as a carrier wave. The term "modulated data signal" means a signal that has one or more of its characteristics set or changed in such a manner as to encode information in the signal. By way of example, and not limitation, communication media includes wireless media such as acoustic, RF, infrared and other wireless media, as well as wired media. Example embodiments are also directed to such communication media.

As noted above, computer programs and modules (including application programs 932 and other program modules 934) may be stored on the hard disk, magnetic disk, optical disk, ROM, or RAM. Such computer programs may also be received via network interface 950 or serial port interface 942. Such computer programs, when executed or loaded by an application, enable computer 900 to implement features of embodiments discussed herein. Accordingly, such computer programs represent controllers of the computer 900.

Example embodiments are also directed to computer program products comprising software (e.g., computer-readable instructions) stored on any computer-useable medium. Such software, when executed in one or more data processing devices, causes data processing device(s) to operate as described herein. Embodiments may employ any computer-useable or computer-readable medium, known now or in the future. Examples of computer-readable mediums include, but are not limited to storage devices such as RAM, hard drives, floppy disks, CD ROMs, DVD ROMs, zip disks, tapes, magnetic storage devices, optical storage devices, MEMS-based storage devices, nanotechnology-based storage devices, and the like.

It will be recognized that the disclosed technologies are not limited to any particular computer or type of hardware. Certain details of suitable computers and hardware are well known and need not be set forth in detail in this disclosure.

V. Conclusion

The above detailed description refers to the accompanying drawings that illustrate exemplary embodiments of the present invention. However, the scope of the present invention is not limited to these embodiments, but is instead defined by the appended claims. Thus, embodiments beyond those shown in the accompanying drawings, such as modified versions of the illustrated embodiments, may nevertheless be encompassed by the present invention.

References in the specification to "one embodiment," "an embodiment," "an example embodiment," or the like, indicate that the embodiment described may include a particular feature, structure, or characteristic, but every embodiment may not necessarily include the particular feature, structure, or characteristic. Moreover, such phrases are not necessarily referring to the same embodiment. Furthermore, when a particular feature, structure, or characteristic is described in connection with an embodiment, it is submitted that it is within the knowledge of one skilled in the relevant art(s) to implement such feature, structure, or characteristic in connection with other embodiments whether or not explicitly described.

Descriptors such as "first", "second", "third", etc. are used to reference some elements discussed herein. Such descriptors are used to facilitate the discussion of the example embodiments and do not indicate a required order of the referenced elements, unless an affirmative statement is made herein that such an order is required.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims, and other equivalent features and acts are intended to be within the scope of the claims.

What is claimed is:

1. An electronic device comprising:
a speaker configured to output audio content;
a microphone configured to receive background noise and the audio content; and
a controller coupled to the speaker and the microphone, the controller configured to:
 determine a loudness difference between a loudness of the audio content and a loudness of the background noise;
 compare the loudness of the audio content to an upper loudness threshold;
 select a modulation from a plurality of modulations based on at least one of the loudness difference or the comparison,
  wherein a first modulation is to be selected in accordance with the loudness difference being less than a threshold difference and the loudness of the audio content being less than the upper loudness threshold,
  wherein a second modulation is to be selected in accordance with the loudness difference being greater than or equal to the threshold difference and the loudness of the audio content being less than the upper loudness threshold, and
  wherein a third modulation is to be selected in accordance with the loudness of the audio content being greater than or equal to the upper loudness threshold; and
 modulate subsequent outputted audio content using the selected modulation.

2. The electronic device of claim 1, wherein the audio content includes a plurality of audio components that correspond to a plurality of respective frequencies;
wherein the first modulation is configured to compress the audio content more than an upper threshold compression amount;
wherein the second modulation is configured to compress the audio content less than a lower threshold compression amount that is less than or equal to the upper threshold compression amount; and
wherein the third modulation is configured to increase loudness of a first subset of the audio components, and to decrease loudness of a second subset of the audio components less than a designated threshold amount, based on each audio component in the first subset having a loudness that is less than a lower loudness threshold and further based on each audio component in the second subset having a loudness that is greater than or equal to the lower loudness threshold.

3. The electronic device of claim 2, wherein the first modulation is further configured to use automatic gain control to change the loudness of the audio content to be substantially equal to a target loudness in a designated frequency range in a passband of the speaker in response to the audio content being compressed.

4. The electronic device of claim 2, wherein the second modulation is configured to not compress the audio content in a designated frequency range in a passband of the speaker.

5. The electronic device of claim 2, wherein the third modulation is configured to not change the loudness of the second subset of the audio components based at least in part on each audio component in the second subset having a loudness that is greater than or equal to the lower loudness threshold.

6. The electronic device of claim 1, wherein the controller is configured to:
analyze an audio profile of the audio content, the audio profile indicating one or more audio attributes of the audio content that identify the audio content; and
select the modulation further based on the one or more audio attributes that are indicated by the audio profile of the audio content.

7. The electronic device of claim 1, wherein the controller is configured to:
analyze a type of the audio content; and
select the modulation further based on the type of the audio content.

8. The electronic device of claim 1, wherein the controller is configured to:
determine a type of the electronic device; and
select the modulation further based on the type of the electronic device.

9. The electronic device of claim 1, wherein the controller is configured to:
sample the audio content and the background noise periodically over a plurality of time periods while a software application with which the audio content is associated is in use; and
determine the loudness difference, compare the loudness of the audio content to the upper loudness threshold, select the modulation, and modulate the subsequent outputted audio content for each of the plurality of time periods.

10. The electronic device of claim 9, wherein the controller is further configured to:
analyze an audio profile of audio content, the audio profile indicating one or more audio attributes of the audio content that identify the audio content; and
determine the plurality of time periods over which the audio content and the background noise are to be sampled based at least in part on the one or more audio attributes that are indicated by the audio profile of the audio content.

11. The electronic device of claim 9, wherein the controller is configured to:
sample the audio content and the background noise at a plurality of time instances that correspond to the plurality of respective time periods based at least in part on the loudness of the audio content being less than a specified loudness threshold at the plurality of respective time instances.

12. The electronic device of claim 1, wherein the controller is configured to:
sample a plurality of frequency bands of each of the audio content and the background noise; and
determine the loudness difference, compare the loudness of the audio content to the upper loudness threshold, select the modulation, and modulate the subsequent outputted audio content for each frequency band of the plurality of frequency bands.

13. A method comprising:
determining a loudness difference between a loudness of audio content that is outputted by a speaker and a loudness of background noise;

comparing the loudness of the audio content to an upper loudness threshold;
selecting a modulation from a plurality of modulations based on at least one of the loudness difference or the comparison,
  wherein a first modulation is to be selected in accordance with the loudness difference being less than a threshold difference and the loudness of the audio content being less than the upper loudness threshold,
  wherein a second modulation is to be selected in accordance with the loudness difference being greater than or equal to the threshold difference and the loudness of the audio content being less than the upper loudness threshold, and
  wherein a third modulation is to be selected in accordance with the loudness of the audio content being greater than or equal to the upper loudness threshold; and
modulating subsequent outputted audio content using the selected modulation.

14. The method of claim 13, wherein the audio content includes a plurality of audio components that correspond to a plurality of respective frequencies;
  wherein the first modulation is configured to compress the audio content more than an upper threshold compression amount;
  wherein the second modulation is configured to compress the audio content less than a lower threshold compression amount that is less than or equal to the upper threshold compression amount; and
  wherein the third modulation is configured to increase loudness of a first subset of the audio components, and to decrease loudness of a second subset of the audio components less than a designated threshold amount, based on each audio component in the first subset having a loudness that is less than a lower loudness threshold and further based on each audio component in the second subset having a loudness that is greater than or equal to the lower loudness threshold.

15. The method of claim 14, wherein the first modulation is configured to compress the audio content more than the upper threshold compression amount in a designated frequency range in a passband of the speaker;
  wherein the second modulation is configured to compress the audio content less than the lower threshold compression amount in the designated frequency range in a passband of the speaker
  wherein the upper threshold compression amount is greater than or equal to 1.4; and
  wherein the lower threshold compression amount is less than or equal to 1.4.

16. The method of claim 13, further comprising:
detecting that a user of a user device that includes the speaker switches from interacting with a first software application to interacting with a second software application; and
sampling the audio content and the background noise based at least in part on detection that the user switches from interacting with the first software application to interacting with the second software application;
wherein determining the loudness difference comprises:
  determining the loudness difference based at least in part on sampling the audio content and the background noise.

17. The method of claim 13, further comprising:
detecting that a user of a user device that includes the speaker changes a volume control on the user device from a first volume setting to a second volume setting; and
sampling the audio content and the background noise based at least in part on detection that the user changes the volume control on the user device;
wherein determining the loudness difference comprises:
  determining the loudness difference based at least in part on sampling the audio content and the background noise.

18. The method of claim 13, further comprising:
analyzing an audio profile of the audio content, the audio profile indicating one or more audio attributes of the audio content that identify the audio content;
wherein selecting the modulation comprises:
  selecting the modulation to set a loudness of the audio content such that the loudness of the audio content is based at least in part on the one or more audio attributes that are indicated by the audio profile of the audio content.

19. The method of claim 13, further comprising:
sampling the audio content and the background noise periodically at a plurality of time instances corresponding to a plurality of respective time periods;
wherein a duration of each time period is tunable such that the duration of each time period increases as a rate at which the loudness of the background noise changes decreases and further such that the duration of each time period decreases as the rate at which the loudness of the background noise changes increases; and
wherein determining the loudness difference, comparing the loudness of the audio content to the upper loudness threshold, selecting the modulation, and modulating the subsequent outputted audio content are performed for each of the plurality of time periods.

20. The method of claim 13, further comprising:
analyzing a loudness profile of a software application with which the audio content is associated, the loudness profile indicating a plurality of loudness values that are targeted by the software application for a plurality of respective frequencies in audio content that is processed by the software application;
wherein selecting the modulation comprises:
  selecting the modulation further based on the plurality of loudness settings that are indicated by the loudness profile of the software application.

21. A computer program product comprising a computer-readable storage device having instructions recorded thereon for enabling a processor-based system to perform operations, the operations comprising:
determining a loudness difference between a loudness of audio content that is outputted by a speaker and a loudness of background noise;
comparing the loudness of the audio content to an upper loudness threshold;
selecting a modulation from a plurality of modulations based on at least one of the loudness difference or the comparison,
  wherein a first modulation is to be selected in accordance with the loudness difference being less than a threshold difference and the loudness of the audio content being less than the upper loudness threshold,
  wherein a second modulation is to be selected in accordance with the loudness difference being greater than or equal to the threshold difference and the loudness of the audio content being less than the upper loudness threshold, and wherein a third modulation is to be selected in accordance with the loudness of the audio content being greater than or equal to the upper loudness threshold; and modulating subsequent outputted audio content using the selected modulation.

\* \* \* \* \*